United States Patent [19]
Nakazawa et al.

[11] Patent Number: 5,614,730
[45] Date of Patent: Mar. 25, 1997

[54] ACTIVE MATRIX SUBSTRATE

[75] Inventors: Takashi Nakazawa; Hideto Ishiguro, both of Suwa, Japan

[73] Assignee: Seiko Epson Corporation, Tokyo, Japan

[21] Appl. No.: 790,253

[22] Filed: Nov. 8, 1991

[30] Foreign Application Priority Data

| Nov. 9, 1990 | [JP] | Japan | 2-305069 |
|---|---|---|---|
| Nov. 20, 1990 | [JP] | Japan | 2-315424 |
| Nov. 20, 1990 | [JP] | Japan | 2-315426 |
| Nov. 22, 1990 | [JP] | Japan | 2-318810 |
| Apr. 9, 1991 | [JP] | Japan | 3-076404 |
| May 7, 1991 | [JP] | Japan | 3-101246 |
| May 9, 1991 | [JP] | Japan | 3-104244 |
| May 10, 1991 | [JP] | Japan | 3-105768 |
| Oct. 1, 1991 | [JP] | Japan | 3-253733 |

[51] Int. Cl.$^6$ .................. H01L 29/04; H01L 31/036; H01L 27/01; H01L 27/12
[52] U.S. Cl. .................. 257/59; 257/57; 257/66; 257/72; 257/352; 349/42; 349/145
[58] Field of Search .................. 357/2, 4, 23.7, 357/54; 359/54, 59, 61; 257/57, 59, 66, 72, 347, 350, 352

[56] References Cited

U.S. PATENT DOCUMENTS

| 4,582,395 | 4/1986 | Morozumi | 359/59 |
|---|---|---|---|
| 4,838,654 | 6/1989 | Hamaguchi et al. | 359/59 |
| 4,843,438 | 6/1989 | Koden et al. | 257/59 |
| 4,894,690 | 1/1990 | Okabe et al. | 357/23.7 |
| 4,918,504 | 4/1990 | Kato et al. | 357/23.7 |
| 4,990,460 | 2/1991 | Moriyama | 357/23.7 |
| 5,054,887 | 10/1991 | Kato et al. | 357/23.7 |
| 5,155,564 | 10/1992 | Hishida et al. | 257/72 |

FOREIGN PATENT DOCUMENTS

| 0304657 | 7/1988 | European Pat. Off. | 257/59 |
|---|---|---|---|
| 0329274 | 1/1989 | European Pat. Off. | 257/59 |
| 62-247337 | 10/1987 | Japan | 359/59 |
| 1-52130 | 2/1989 | Japan | 359/54 |
| 1283519 | 11/1989 | Japan | 257/59 |
| 2-106723 | 4/1990 | Japan | 359/59 |
| 2-165124 | 6/1990 | Japan | 359/59 |
| 2120724 | 8/1990 | Japan | 257/59 |

OTHER PUBLICATIONS

H. Ohshima, et al., "9.5 in. Poly–Si TFT–LCD with New Transistor Configuration" SID Digest of Technical Papers, May 24–26, 1988, pp. 408–411.

Kinya Kato, et al., "Planarized Active–Matrix for Large–Area High Resolution LCDs", SID Digest of Technical Papers, May 24–26, 1988, pp. 412–415.

M. Katayama et al., "High Resolution Full–Color LCDs Addressed by Double–Layered Gate–Insulator a–Si TFTs", SID Digest of Technical Papers, May 24–26, 1988, pp. 310–313.

Osamu Tomita, et al., "A 6.5–in.–Diagonal TFT–LCD Module for Liquid–Crystal TV", SID Digest of Technical Papers, May 16–18, 1989, pp. 151–154.

K. Ichikawa, et al., "14.3–in.–Diagonal 16–Color TFT–LCD Panel Using a Si:H TFTs", SID Digest of Technical Papers, May 16–18, 1989, pp. 226–229.

Y. Matsueda, et al., "New Technologies for Compact TFT LCDs with High–Aperture Ratio", SID Digest of Technical Papers, May 15–17, 1990, pp. 315–318.

Primary Examiner—Steven H. Loke
Attorney, Agent, or Firm—Oliff & Berridge

[57] ABSTRACT

There is disclosed an active matrix substrate including on a given substrate a thin film transistor, a scanning line connected to the gate of the thin film transistor, a data bus connected to the source of the thin film transistor, and a picture element electrode connected to the data bus through the thin film transistor, the active matrix substrate comprising a structure of the scanning line having the surface covered with an insulating film. A semiconductor layer covered with a gate insulating film constituting the thin film transistor, and a gate electrode constituting the thin film transistor, which are laid on each other in the stated order.

7 Claims, 32 Drawing Sheets

ACTIVE MATRIX SUBSTRATE

BACKGROUND OF THE INVENTION

1. Field of the Invention

This invention relates to an active matrix substrate for use in active matrix-type liquid crystal displays, image sensors, three-dimensional integrated circuits, etc.

2. Related Background Art

The conventional active matrix substrates have the structure described in, e.g., Japan Display '86, 1986 issue, ps. 196 to 199. FIG. 2 schematically shows its generalized structure. FIG. 2A is a top view of the generalized structure, and FIG. 2B is a sectional view along the line A—A' in FIG. 2A. There are formed a source region 202 and a drain region 203 of a polycrystal silicon thin film having impurities added as donors or acceptors, on a substrate of glass, quartz, sapphire or others. In contact with them are provided a data bus 103 and a picture element electrode 197. A semiconductor layer 206 of a polycrystal silicon thin film is formed in contact with the source region 202 and the drain region 203 to connect both regions 202; 203. A gate insulating film 111 is formed to cover these elements. In contact with the gate insulating film 111 there is provided a gate electrode integrated with a scanning line 101.

But the conventional thin film transistor has the following problems.

Because the data bus 108 and the picture element electrode 107 are provided adjacent to each other, the defect of short-circuits between the data bus 108 and the picture element electrode 107 has frequently taken place due to defective photoresists, etc. in photolithographing.

Furthermore the intersection between the data bus 108 and the scanning line 101 is insulated by one layer of the gate insulating film 111. When a defect, such as a pin hole, or others, takes place, the data bus 108 and the scanning line 101 are short-circuited, and resultantly required data signals and scan signals cannot be supplied to the thin film transistor. In the case the conventional active matrix substrate is applied to an active matrix-type liquid crystal display, this causes line defects on the display screen, with resultant problems that the display quality is much lowered; that data cannot be accurately displayed; that the yield of the active matrix substrate is lowered; that the defect inspection on the active matrix is essential, which much increases the cost; and other problems.

SUMMARY OF THE INVENTION

This invention is for solving the above-described problems, and an object of this invention is to provide an active matrix substrate which is, in principle, free from the defect of short-circuits.

The active matrix substrate according to this invention has a structure comprising a scanning line having the surface covered with an insulating film, a gate insulating film-covered semiconductor layer constituting a thin film transistor, and a gate electrode constituting the thin film transistor, which are laid on each other on a given substrate, and preferably has a pad at the intersection of the scanning line and a data bus, and other places.

In the active matrix substrate according to this invention, the insulating film-covered scanning line, the gate insulating film-covered semiconductor layer are laid on each other, whereby the intersection between the scanning line and the data bus has a multi-layer structure. Consequently, even when a defect, such as a pin hole or others, takes place in one of the layers, the remaining layers which are free from the defect retain the insulation, and no short-circuit defect takes place. Furthermore, the scanning line and the gate electrode are separately provided, and consequently their optimum materials can be optionally selected. In addition, since the scanning line can be disposed at the lower position, it is possible to make the insulation resistance between the scanning line and a liquid crystal layer can be made high. Consequently the application of the direct current to the liquid crystal can be reduced.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

This invention will be explained below in good detail by means of embodiments of this invention.

Figure 1A:
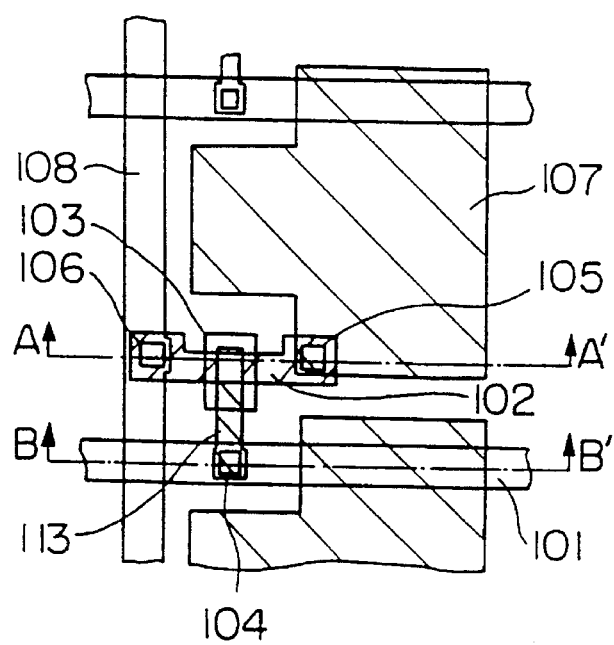
FIG. 1A is a top view of the structure of the active matrix substrate according to a first embodiment of the present invention.
Figure 1B:
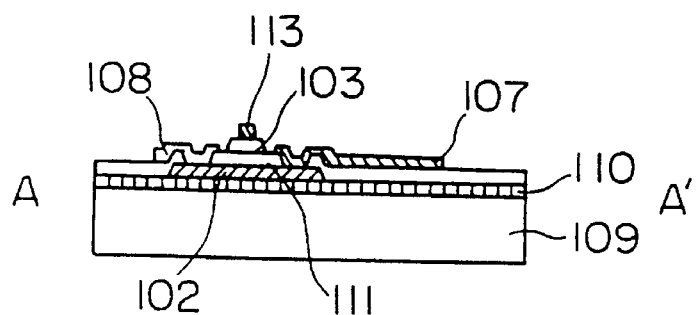
FIG. 1B is a sectional view of the thin film transistor along the line A—A' in FIG. 1A.
Figure 1C:
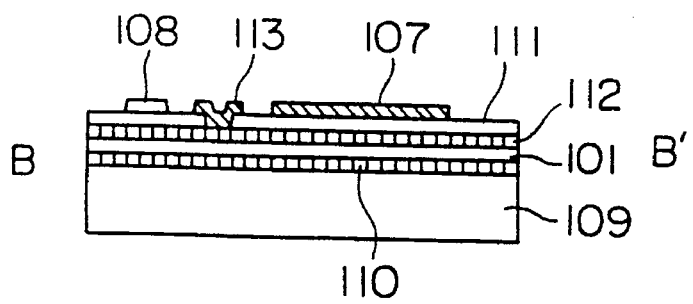
FIG. 1C is a sectional view of the intersection along the line B—B' in FIG. 1A.
Figure 2A:
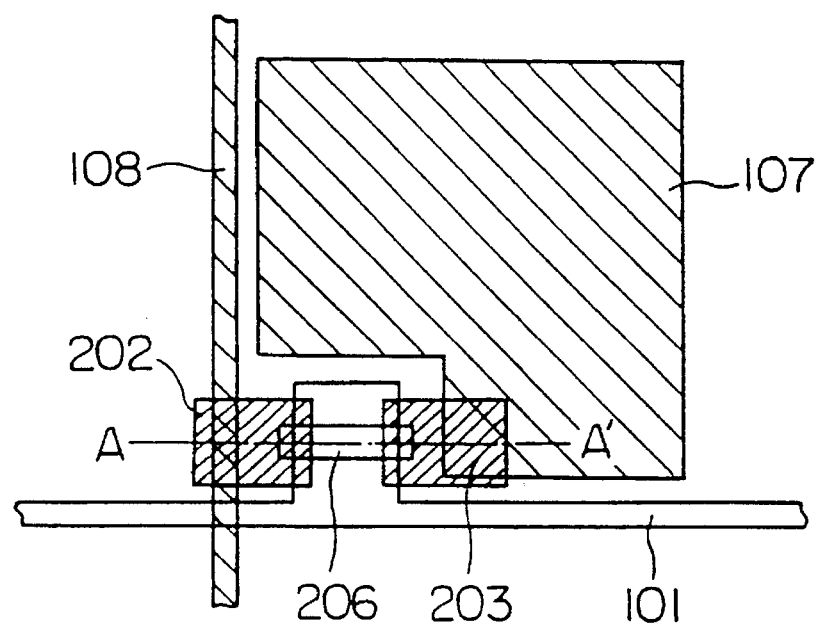
FIG. 2A is a top view of the structure of the conventional active matrix substrate.
Figure 2B:
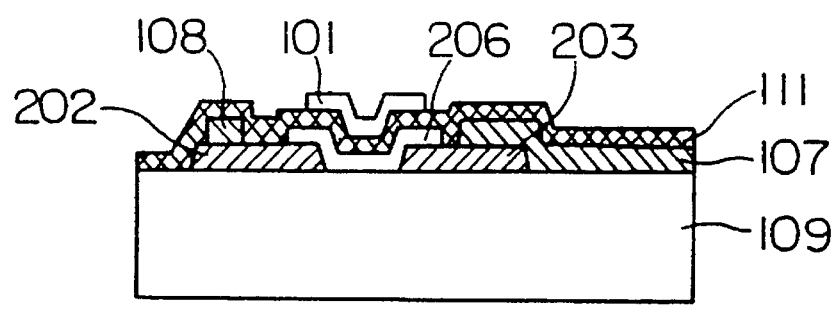
FIG. 2B is a sectional view of the thin film transistor along the line A—A' in FIG. 2B.

FIGS. 1A, 1B and 1C show the active matrix substrate according to a first embodiment of this invention. FIG. 1A is a top view of the active matrix substrate according to a first embodiment of this invention, FIG. 1B is a sectional view along the line A—A' in FIG. 1A, and FIG. 1C is a sectional view along the line B—B' in FIG. 1A. A protective insulating film 110 of tantalum oxide is formed on a substrate 109 of glass, quartz, ceramics, silicon or others, and thereon a scanning line 101 of tantalum covered with a tantalum oxide film 112 is laid. The tantalum oxide forming the protective insulating film 110 is prepared by forming tantalum in a 50 to 200 nm thickness-layer by sputtering and leaving the same in 500° C. oxygen ambient atmosphere for about 1 hour and subsequently thermally oxidizing the same. The scanning line 101 is prepared by forming a 300 to 500 nm thickness tantalum layer by sputtering and processing the tantalum by photo-lithography technology into a pattern of FIG. 1, and then covering the same with the tantalum oxide film 112 of an about 150 to 200 nm thickness at 100 V by anodic oxidation.

A semiconductor layer 102 which is the active region of a thin film transistor, is formed by decomposing monosilane gas in vacuum of 600° C. by low-pressure CVD (LPCVD) to deposit polycrystal silicon in a thickness of 25 nm. LPCVD is not essentially used to form the polycrystal silicon. The polycrystal silicon may be prepared by forming amorphous silicon by, e.g., sputtering or plasma CVD, and subsequently polycrystallizing the amorphous silicon by a 5 to 40 hour heat-treatment at 550° to 800° C., or by radiation of argon laser, excimer laser or others.

Next, a gate insulating film 111 of silicon dioxide is formed in a 150 nm thickness by electron cyclotron resonance plasma CVD. The silicon dioxide formed by ECR plasma CVD (referred as ECR-CVD hereinafter) is dense, and has few traps and is as good as the thermal-oxide film of silicon. The ECR plasm CVD can be performed at a low temperature equal to or lower than 100° C. and is optimum for the gate insulating film 111. Then a gate electrode 103 is formed of conductive phosphorus doped-silicon film in a 300–500 nm thickness by LPCVD. With the gate electrode 103 used as a mask, phosphorus ions are implanted in the semiconductor layer 102 at 120 KeV and at a given concentration to form a source region and a drain region by self-alignment. By the implantation of phosphorus ions an n-channel thin film transistor can be prepared, and by the implantation of boron ions a p-channel thin film transistor can be prepared. By implanting selectively different kinds of ions with a photoresist or others used, CMOS type inverters can be easily realized.

Subsequently the implanted ions are radiated with excimer laser to be activated, and those of the silicon layers in the source region and in the drain region are made low resistance. The gate insulating film 111 is etched with a mixed liquid of hydrogen fluoride and ammonium fluoride to open contact holes 104, 105, 108. This mixed liquid of hydrogen fluoride and ammonium fluoride does not substantially damage the semiconductor layer 102 of the impurities-implanted polycrystal silicon below the contact holes 105, 106, and the tantalum oxide film 112 below the contact hole 104. Consequently only the gate insulating film 111 of silicon dioxide can be selectively etched.

Next, a pixel electrode 107 is formed of an ITO film in a thickness of 30 to 200 nm. Concurrently a gate line 113 is formed to connect the contact hole 104 formed on the scanning line 101 to the gate electrode 103. In forming the gate line 113, it is noted that the gate line 113 is not narrower at the intersection between the semiconductor layer 102 and the gate electrode 103 than a width of the gate electrode 103, i.e., a channel length of the thin film transistor. This is for preventing the gate line 113 from overlapping the source region or the drain region to adversely increase a parasitic capacitance. Finally a data bus 108 is formed of an alloy of aluminum and silicon in a 500–800 nm thickness.

The active matrix substrate of this structure has the multi-layer structure of the tantalum oxide film 112 and the gate insulating film 111 at the intersection between the scanning line 101 and the data bus 106. This multi-layer structure is also at the intersection between the scanning line 101 and a holding capacity line (not shown). This multi-layer structure is also at the intersections between the scanning line 101 and the pixel electrode 107, and between the holding capacity line and the pixel electrode 107. The gate electrode 103 and the scanning line 101 are connected to each other in the contact hole 104 by a capacity of the tantalum oxide film 112 as a dielectric.

Figure 3A:
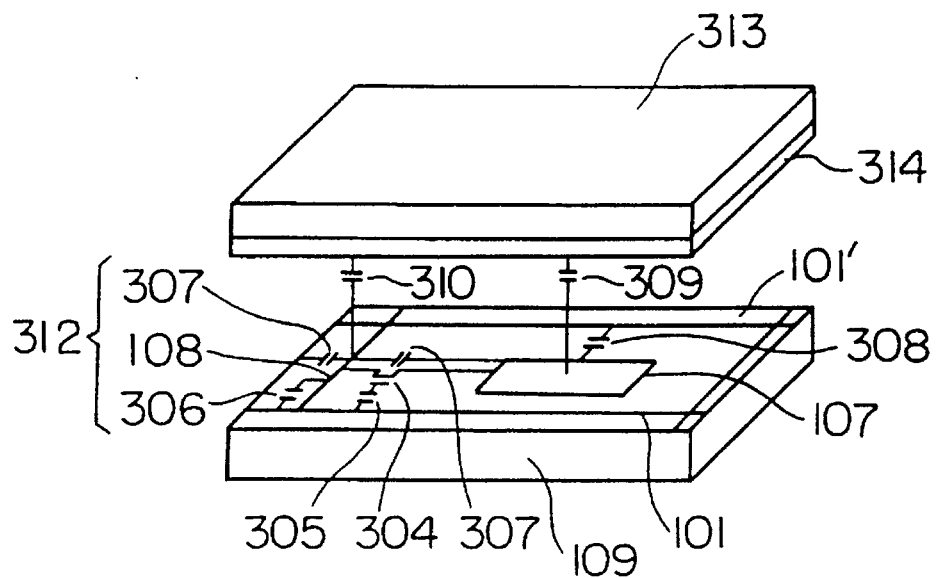
FIG. 3A is a schematic view of a liquid crystal display using the active matrix substrate according to this invention.
Figure 3B:
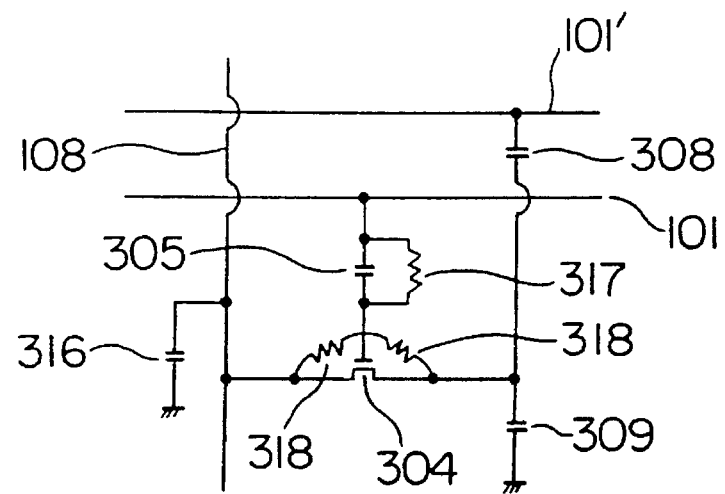
FIG. 3B is an equivalent circuit of FIG. 3A.

FIG. 3A schematically shows a liquid crystal display using the active matrix substrate according to this invention. FIG. 3B shows an equivalent circuit of FIG. 3A. This liquid crystal display comprises a liquid crystal layer 312 sandwiched between the active matrix substrate according to this invention formed on a substrate 109 and an opposed substrate 313 with a common electrode 314. A coupling capacitance 305 is constituted by a gate electrode 103 of a thin film transistor 304 and a scanning line 101, a capacitance 306 is constituted at the intersection between the scanning line 101 and the data bus 108, and a capacity 307 is constituted by the data bus 108 and a pixel electrode 107 neighboring the data bus 108. A capacitance 310 is constituted by the data bus 108, and the common electrode 314 on the opposed substrate 313. A capacitance 316 in FIG. 3B is a total capacitance of the data bus 108 combining the capacitances 306, 307, 310.

A holding capacitance 308 is constituted by the scanning line 101 and the pixel electrode 107. A capacitance 309 of the liquid crystal layer 312 is constituted by the pixel electrode 107 and the common electrode 314. An insulation resistance 317 is parallel with the coupling capacitance 305 of the scanning line 101 and the gate electrode 103, and a resistor 318 is an insulation resistance between the gate electrode of the thin film transistor 304, and the source electrode thereof or the drain electrode thereof. An insulation resistance 317 is a thickness-wise resistance of the tantalum oxide film 112 formed by oxidizing the tantalum surface of the scanning line 101 by anodic oxidation, and an insulation resistance 318 is a thickness-wise resistance of the gate insulating film 111 making up the thin film transistor.

Figure 4A:
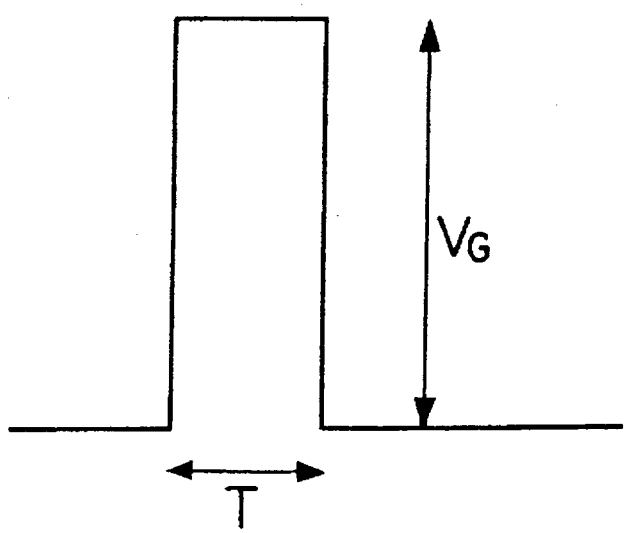
FIG. 4A is a view of a signal voltage applied to the scanning line of the liquid crystal display of FIG. 3A.
Figure 4B:
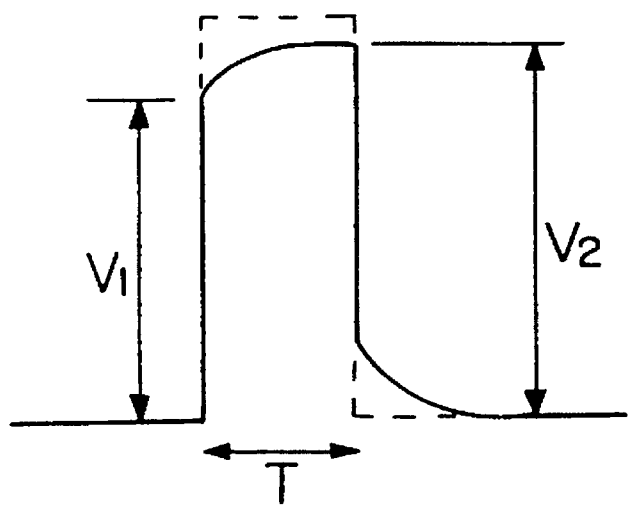
FIG. 4B is a view of a signal voltage applied to the gate electrode of the thin film transistor of the liquid crystal display of FIG. 3A.

A signal voltage of FIG. 4A is supplied to the scanning line 101 of the liquid crystal display of this structure, and during a selecting time T a voltage $V_G$ is supplied to the gate electrode 103 to turn on the thin film transistor. Because of the coupling capacitance 305 between the scanning line 101 and the gate electrode 103, the signal voltage of FIG. 4B applied to the gate electrode 103 is actually as shown in FIG. 4B. At the start of the selecting time T, the signal voltage is divided by the coupling capacitance 305 and a MOS capacitance of the thin film transistor. When the coupling capacity 305 is represented by $C_{cup}$, and the MOS capacitance of the thin film transistor is represented by $C_{tft}$, $V_1$ in FIG. 4B is expressed by $$V_1 = V_G (C_{cup}/(C_{cup}+C_{tft})).$$

As seen from this formula, to make $V_1$ near to $V_G$, it is preferable that compared with $C_{tft}$, $C_{cup}$ is sufficiently large, and there will be no problem if at least $$C_{cup} > C_{tft}$$

is satisfied.

When the channel length of the thin film transistor of FIG. 1 is 4 μm, and the channel width thereof is 4 μm, the MOS capacitance $C_{tft}$ is about 3.7 pF. On the other hand, when the size of the contact hole 104 is 5 μm square, the thickness of the tantalum insulating film 112 is 150 μm, and the dielectric constant is 28, the MOS capacitance $C_{tft}$ is about 41 pF.

$$V_1 = 0.92 V_G$$

can be given. A voltage sufficient to turn on the thin film transistor can be supplied.

At the end of the selecting time T, the signal voltage is divided by an insulation resistance 317 of the coupling capacitance 305 and an insulation resistance of the thin film transistor 304. When the insulation resistance 317 is represented by Tcup, and the insulation resistance of the gate insulating film 111 is represented by $R_{tft}$, $V_2$ in FIG. 4B is expressed by $$V_2 = V_G (R_{tft}/(R_{cup}+R_{tft}))$$

As seen from this formula, to make $V_2$ near to $V_G$, it is preferable that compared with $T_{cup}$, $R_{tft}$ is sufficiently large, and there will be no problem if at least $$R_{tft} > R_{cup}$$

is satisfied. The insulation resistance has voltage dependency due to a "Poole-Frenkel conduction current" flowing through the tantalum oxide, and its resistance is $10^{11}$ to $10^{12}$ Ω in the range of 4 to 10 V. The insulation resistance of the gate insulating film of silicon dioxide is $10^{13}$ Ω or higher, and $$V_2 > 0.91 V_G$$

Thus, in the active matrix substrate of FIG. 1, a voltage sufficient to turn on the thin film transistor is applied during the selecting time T, and a voltage drop due to the coupling capacitance 305 is less than 10%. The liquid crystal display can be driven without any problem at the same signal voltage as the conventional one.

Figure 5A:
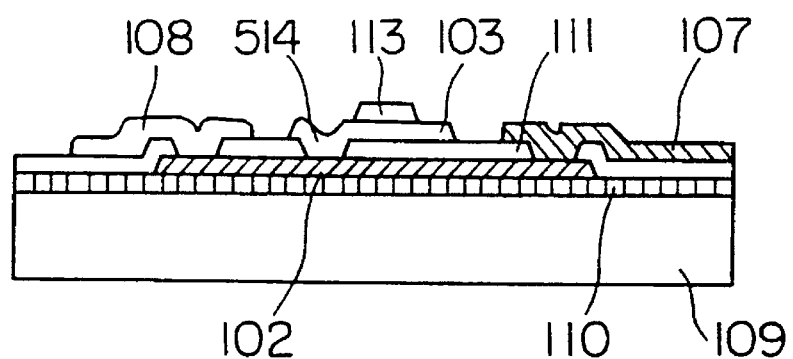
FIG. 5A is a sectional view of a thin film transistor with a short-circuit defect.
Figure 5B:
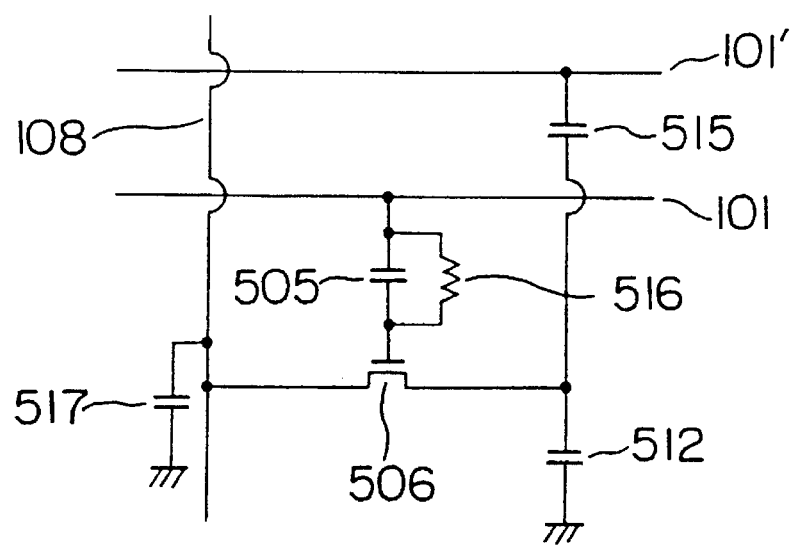
FIG. 5B is a view of an equivalent circuit of the active matrix substrate with the short-circuit defect.

FIG. 5 shows one example of short-circuit defects occurring in an active matrix substrate. FIG. 5A is a sectional view of the thin film transistor in which a short-circuit defect has taken place. FIG. 5B is a part of an equivalent circuit of the active matrix substrate, in which the short-circuit has taken place. Due to a defect 514, e.g., a pin-hole, occurring in the gate insulating film 111, the gate electrode 103 and the semiconductor layer 102 are short-circuited. Because the data bus 108 and the pixel electrode 107 are connected to each other through the contact hole in the semiconductor layer 102, the gate electrode 103 and the data bus 108 and the pixel electrode 107 are short-circuited. This results in the equivalent circuit of FIG. 5B.

Because the gate electrode 103 of the thin film transistor and the scanning line 101 are connected to each other through the coupling capacitance 505, a signal voltage applied to the scanning line 101 is never applied as it is to the data bus 108 or the pixel electrode 107. The signal voltage applied to the scanning line 101 is divided by the total capacitance 517 of the coupling capacitance 505 and the data line 108, and when the total capacitance 517 of the data bus 108 is represented by $C_{data}$, a signal voltage $V_3$ leaking to the data bus 108 is expressed by $$V_3 = V_G (C_{cup}/(C_{cup}+C_{data}))$$

When $C_{data}$ is sufficiently large in comparison with $C_{cup}$, $V_3$ is uninfluentially small, and when at least $C_{data}$ is sufficiently large in comparison with $C_{cup}$, there will be no problem. Generally $C_{data}$ is larger than 30,000 pF, and when $C_{cup}$ is 41 pF, $$V_3 < 0.0014 V_G$$

This leakage is around 1/1000 the signal voltage $V_G$ of the scanning line 101. This leakage never influences at all the signal voltage of the data bus 108.

The leakage of the signal voltage applied to the data bus 108 to the scanning line 101 causes no problem because the total capacitance of the scanning line is generally as large as 50 pF. The insulation resistance 516 of the coupling capacitance 505 is large in comparison with the impedance of the scanning circuit for driving the scanning line 101, and that of the holding circuit for driving the data bus 108, and there is no problems either. In contrast to the above-described insulation resistance 506 of $10^{11}$ to $10^{12}$ Ω, the impedances of the scanning circuit and the holding circuit are usually less than 10–20 KΩ.

Because of the presence of the coupling capacitance 505, even when the short-circuit defect as in FIG. 5A occurs, no mutual signal leakage between the data bus 108 and the scanning line 101 takes place, and the conventional resultant defect of line defects on the display screen has been successfully eliminated. Furthermore, the insulating film of the intersection between the scanning line 101 and the data bus 108, and the insulating film of the holding capacitance each have a two layer-structure of silicon dioxide and tantalum oxide, and even when one of these insulating layers has a defect, as of a pin hole or others, no short-circuit takes place. Even if the silicon dioxide of the intersection or the holding capacitance is etched because of pin holes in the photoresist for forming the contact holes 105, 106, tantalum oxide is not etched by a mixed liquid of hydrogen fluoride and ammonium fluoride, and consequently sufficient insulation can be secured, and no defect of the short-circuit takes place.

One sheet of the active matrix substrate has a number of the data bus 108 × a number of the scanning line 101, i.e., a number of the intersection equal to a number of the pixel, and a number of the holding capacitance and a number of the thin film transistor which correspond to each other one vs. one. A short-circuit defect in the insulating films results in line defects on the display screen and pixel defects. It is a serious problem how to decrease this short-circuit defect. On the other hand, it is essential to the liquid crystal display to realize a higher aperture ratio, a larger contrast ratio, and bright picture quality. This problem can be solved at once by using the active matrix substrate of the structure of FIG. 1.

Since tantalum, which is used as the scanning line 101 in this invention has a specific resistance as high as 100 to 200 μΩ·cm, the sheet resistivity is 2 to 4 Ω/□ even with the tantalum film thickness of 500 nm, and this sheet resistivity is higher by about 2 to 4 times than other metals, such as chromium. Accordingly the scanning line 101 formed of tantalum has a large time constant and is unsuitable for large-area active matrix substrates because of its large signal delay. Accordingly the scanning line formed of tantalum is optimum for active matrix substrates for liquid crystal displays for use in light values for liquid crystal projectors of high precision which are below about diagonally 5 to 6 inches.

Figure 6A:
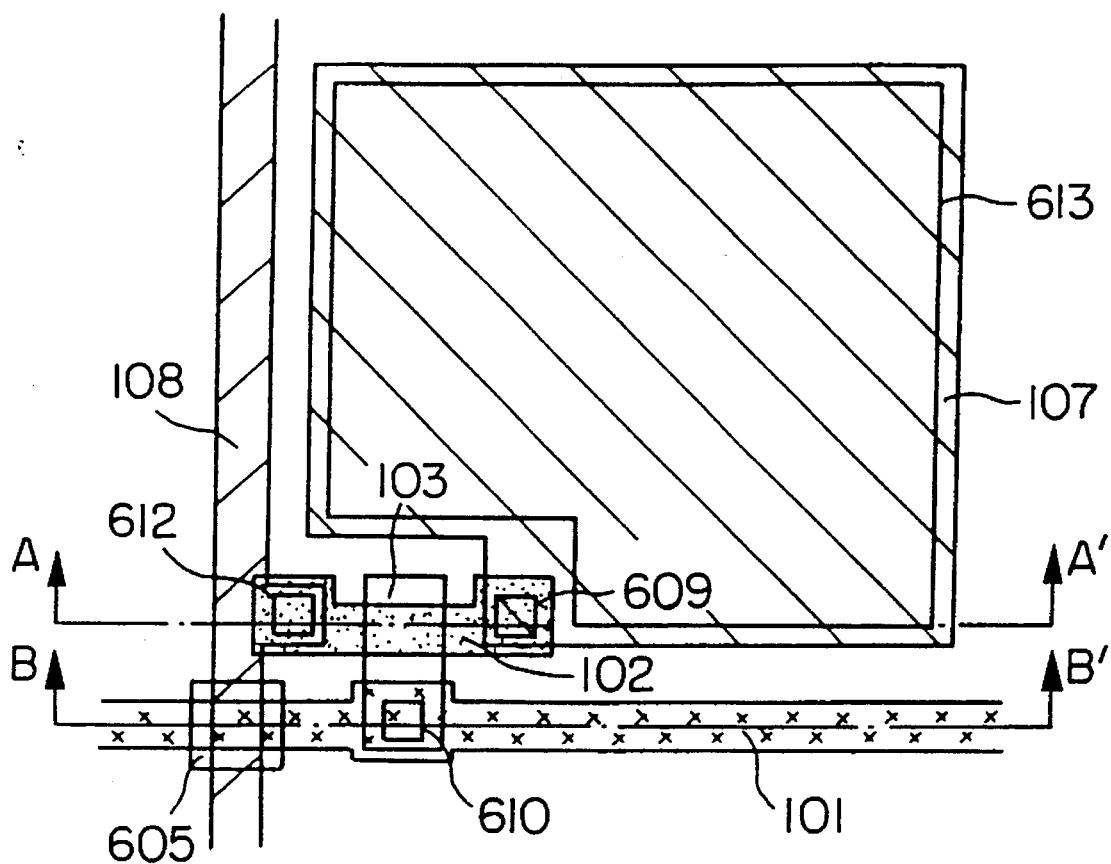
FIGS. 6A, 6B and 6C are views of the structure of the active matrix substrate according to a second embodiment of this invention.
Figure 6B:
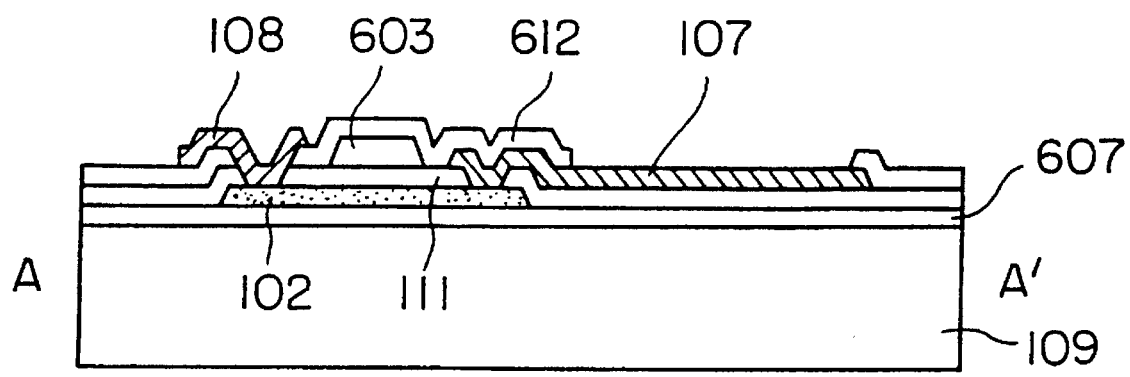
Figure 6C:
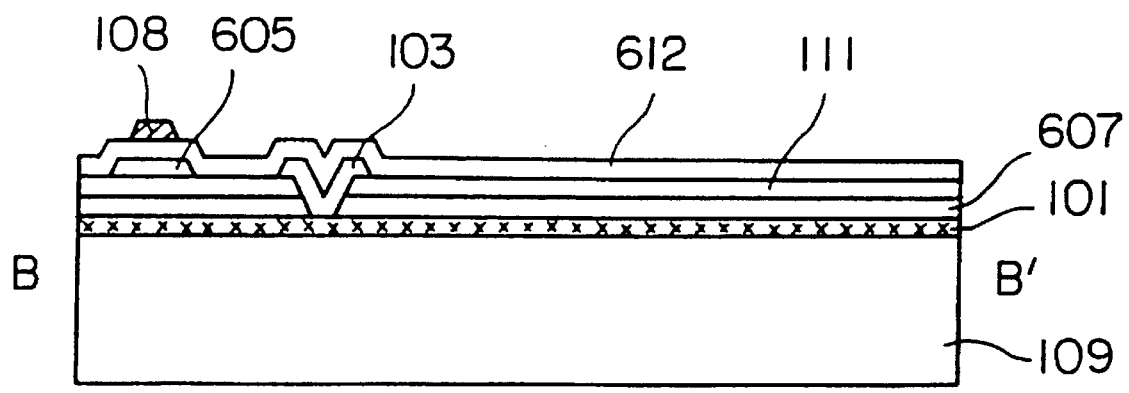

FIG. 6 shows the active matrix substrate according to a second embodiment of this invention. FIG. 6A is a top view of the active matrix substrate according to the second embodiment of this invention, FIG. 6B is a sectional view along the line A—A' in FIG. 6A, and FIG. 6C is a sectional view along the line B—B' in FIG. 6A. As in the first embodiment, a scanning line 101 is formed of a metal, such as Cr, Ta or others, or of a transparent conducting film, such as ITO or others, Then a first inter-film insulating film 607 is formed of an insulating film of silicon dioxide, SiN, tantalum oxide, polyimide resin film or others. Its film thickness is preferably 100 to 1500 nm.

A semiconductor layer 102 of polycrystal silicon, non-crystalline silicon or others is formed on the active region of a thin film transistor. Its thickness is preferably 50 to 300 nm. Subsequently a gate insulating film 111 is formed of silicon dioxide, SiN, tantalum oxide or others in a thickness of 50 to 300 nm. The gate insulating film 111 may be formed by oxidizing the surface of the semiconductor layer 102 by thermal-oxidation.

Next, a contact hole 609 is formed in the semiconductor layer 102, and a contact hole 610 is formed in the scanning line 101. Then a gate electrode 103 is formed of a metal, such as Cr, Mo or others, or an impurity added silicon thin film, and impurities, such as P, B or others, are added to the semiconductor layer 102 with a required energy by ion implantation, doping or other techniques to form the source region and the drain region by self-alignment. The gate electrode 3 has to satisfy the requirements of conductivity, the quality as a mask for the ion implantation forming the source and the drain regions, film thickness, etc.

Concurrently with the formation of the gate electrode 103, a gate electrode 805 is formed of the same material as the former at the intersection between a scanning line 101 and a data bus 108. Then a pixel electrode 107 is formed of a transparent conducting film, such as ITO or others, or a metal film, as of Al, Cr or others, and a second inter-layer insulating film 612 is formed of an insulating film of silicon dioxide, SiN, polyimide resin film or others, The film thickness is preferably 100 to 1500 nm. A contact hole 612, and a window 613 are concurrently formed respectively in the semiconductor layer 102 and the pixel electrode 107. Finally a data bus 108 of a metal, such as Al, Cr or others, is provided. The active matrix substrate of this structure has at the intersection between the scanning line 101 and the gate electrode 103 a pad made up with the first inter-film insulating film 807, the gate insulating film 111, the gate electrode 103 and the second inter-film insulating film 612, so that even if the defect of a pin hole or others occurs in one insulating film at the intersection, this never, in principle, results in the defect of short-circuit.

Figure 7:
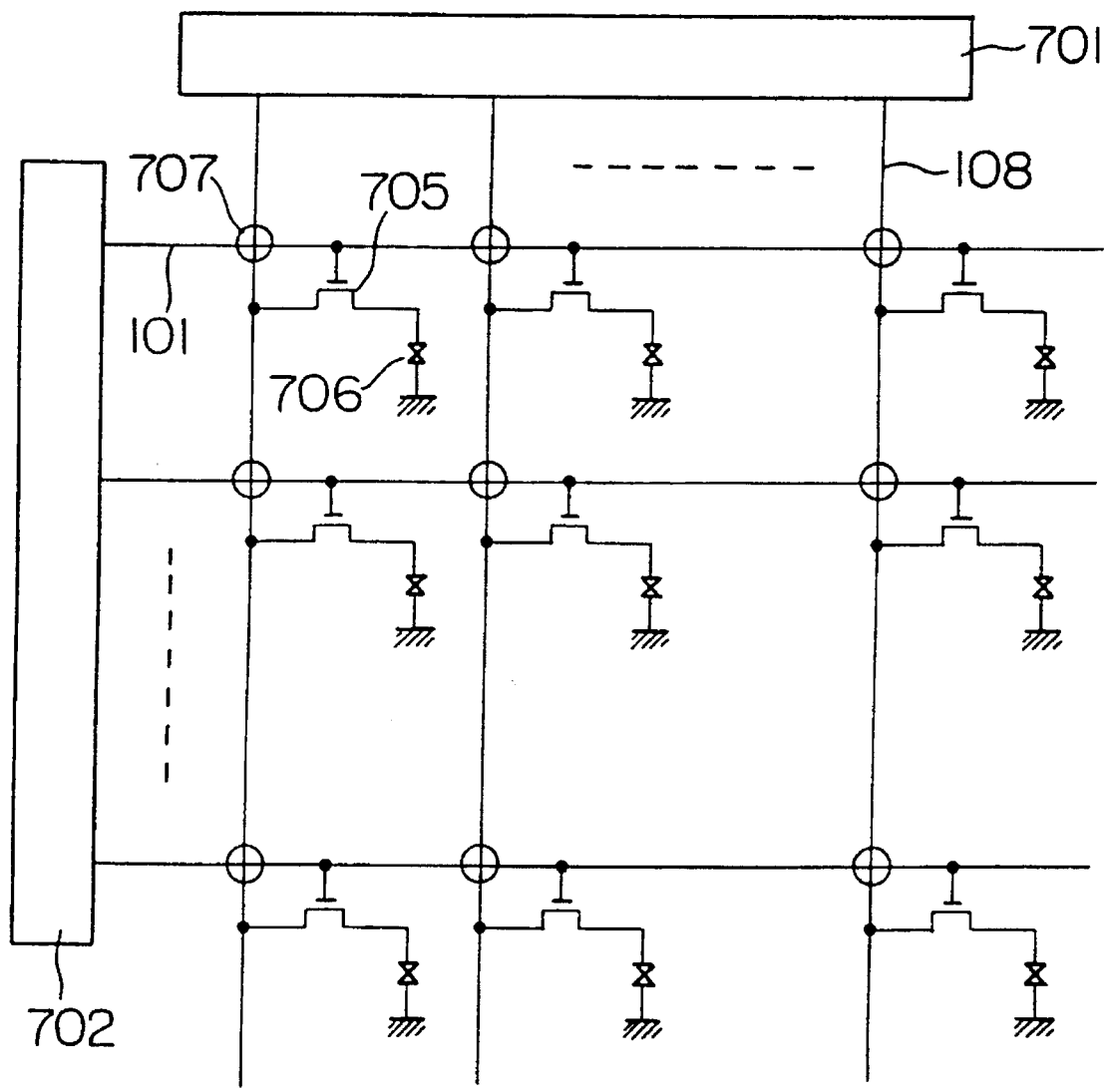
FIG. 7 is a view of an equivalent circuit of the active matrix substrate of FIG. 8.

FIG. 7 shows an equivalent circuit of the active matrix substrate of FIG. 6. The data line 108 is connected to a holding circuit 701, and the scanning line 101 is connected to the scanning circuit 702. The data line and the scanning line 101 are connected respectively to the source and the gate of the thin film transistor. A load 706 is a liquid crystal layer or others. Reference numeral 707 indicates the intersection between the data bus 108 and the scanning line 101, and the above-described pad is formed at this intersection. As seen in FIG. 7, one sheet of active matrix substrate has (a number of the data bus)×(a number of the scanning line) of intersections 707. It is a problem to decrease the short-circuit defect at the intersections, realizing the self-alignment-type thin film transistors of a small parasitic capacitance. The active matrix substrate of the structure of FIG. 6 can solve this problem at once.

By means of the embodiment of FIG. 6, an example in which the gate electrode 805 is provided at the intersection between the data bus 10B and the scanning line 101 has been explained. But in place a semiconductor layer formed concurrently with the semiconductor layer 102 for the thin film transistor, a layer formed concurrently formed with the pixel electrode 107, or a layer combining these layers may be provided. But the gate electrode alone, or a combination of the gate electrode and a semiconductor layer is most preferable because upon implanting dopant ions, such as B, P or others, the gate insulating film 111 and the first inter-film insulating film 607 are damaged, with the result of lowered break-down voltage characteristics.

Figure 8:
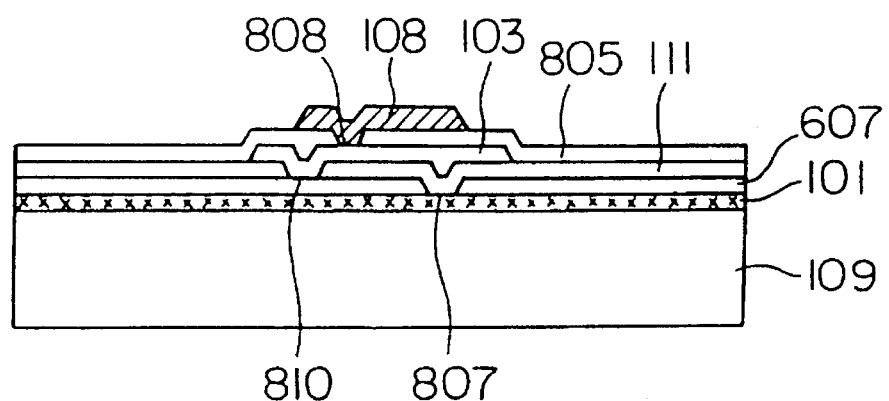
FIG. 8 is a view of one example of the defects of the active matrix substrate of FIG. 8.

FIG. 8 shows one example of cases that a defect occurs at an intersection of the active matrix substrate of FIG. 6. In this example, a pin hole 807, a pin hole 810, and a pin hole 808 occur respectively in the first inter-film insulating film 607, the gate insulating film 111, and the second inter-film insulating film 805 of one and the same intersection. The data line 108, the gate electrode 103, and the scanning line 110 are conducting, but because the first inter-film insulating film 607, the gate insulating film 111 and the second inter-film insulating film 805 are insulators, the data bus 108 and the scanning line 101 are not short-circuited. But when the pin hole 807 and the pin hole 810 take place in identical positions, a short-circuit occurs. But it is remotely possible that pin holes occur in all the insulating films of one intersection, and besides all at identical positions.

Figure 9:
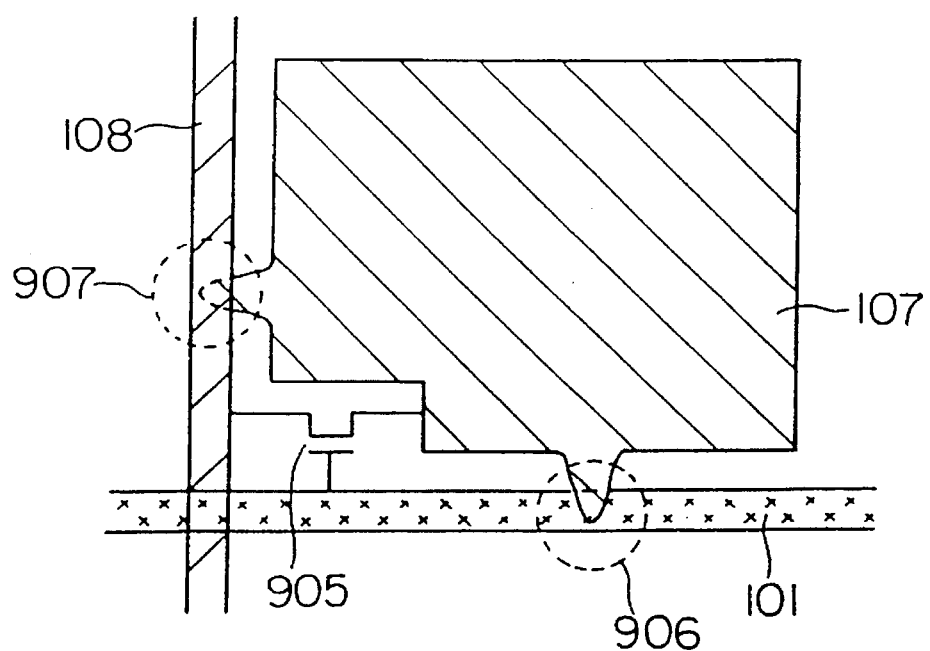
FIG. 9 is a view of one example of the defects of the active matrix substrate FIG. 6.
Figure 10A:
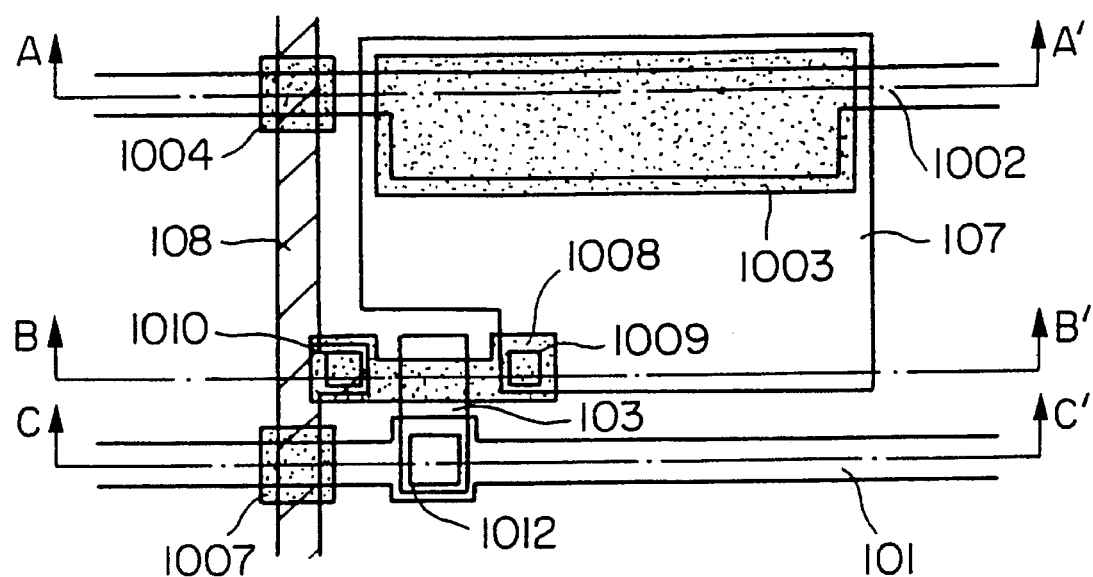
FIGS. 10A, 10B, 10C and 10D are views of the structure of the active matrix substrate according to a third embodiment of this invention.
Figure 10B:
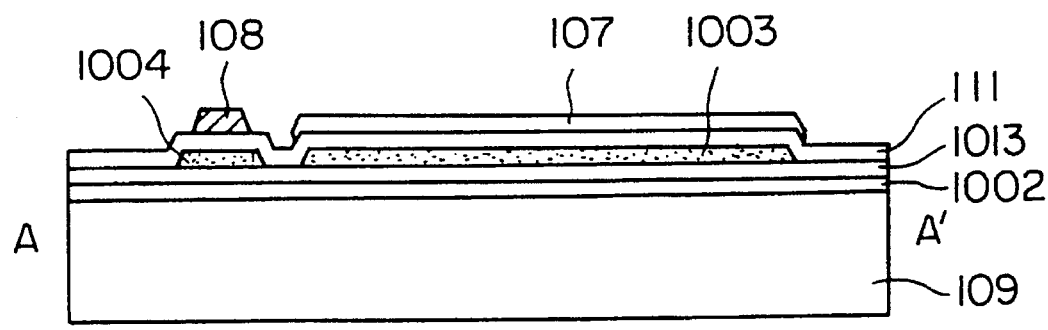
Figure 10C:
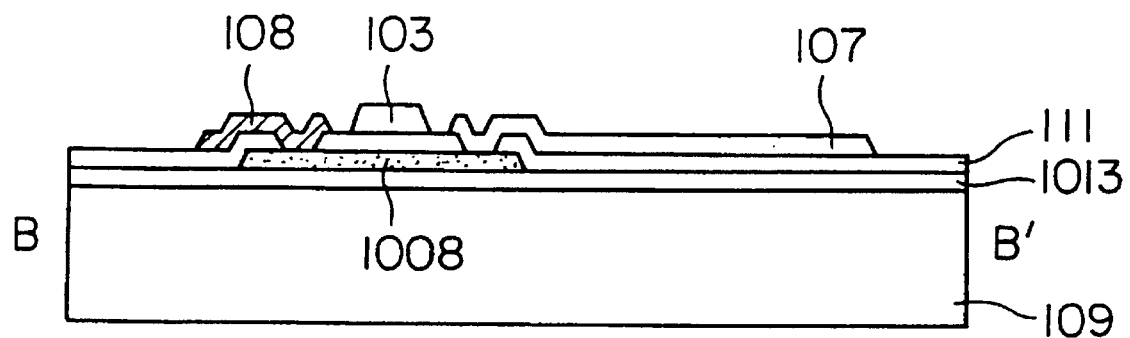
Figure 10D:
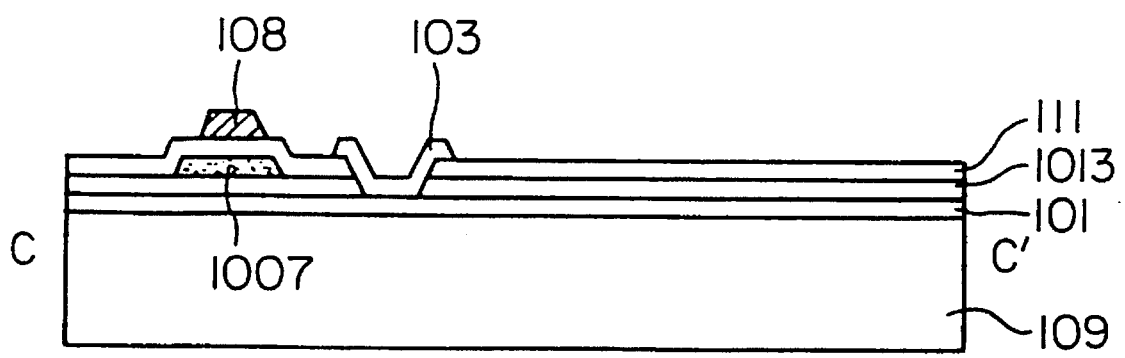

FIG. 9 shows one example that different defects take place in the active matrix substrate of FIG. 6. Especially in the case that in forming the pixel electrode 107, ITO film is selected as its material, projections 906, 907 tend to be formed due to a defect of the film quality of the pixel electrode 107, a defect of a shape of the photoresist, etc. But because the projection 907 is insulated from the data bus 108 by the second inter-film insulating film, no short-circuit defect occurs. Similarly because the projection 906 is insulated by the first inter-film insulating film and the gate insulating film, no short-circuit defect takes place. In short, the pixel electrode is never short-circuited with the data bus 108 and the scanning line 101.

FIG. 10 shows the active matrix substrate according to a third embodiment of this invention. FIG. 10A is a top view of the active matrix substrate, FIG. 10B is a sectional view along the line A—A' in FIG. 10A, FIG. 10C is a sectional view along the line B—B' in FIG. 10A, and FIG. 10D is a sectional view along the line C—C' in FIG. 20A. As described above, a scanning line 101 is formed on a substrate 109. Next a holding capacity line 1002 is formed. The holding capacity line 1002 may be formed of the same material as the scanning line 101 at the same time, or of different materials at a different time. The materials, film thicknesses and line widths of the scanning line 101 and the holding capacitance line 1002 are set so as to satisfy $$\tau_{st} \leq \tau_g$$

$\tau_{st}$ represents a time constant of the scanning line, and $\tau_g$ indicates a time constant of the holding capacitance line 1002.

Subsequently an inter-film insulating film 1013 is formed of an insulating film, e.g., of silicon dioxide, SiN, tantalum oxide, polyimide resin film or others. Preferably the film thickness is 100 to 1500 nm. Semiconductor layers of a silicon thin film, as of polycrystal silicon, non-crystalline Si28silicon or others, are concurrently formed separately on the active region 1008 of a thin film transistor, the intersection between the holding capacity line 1002 and a data bus 108, a holding capacity region constituted by the capacity holding line 1002 and the pixel electrode 107, and the intersection between the scanning line 101 and the data bus 108. It is preferable that the thickness of these layers is 50 to 300 nm. A gate insulating film 111 is formed of an insulating film, as of silicon dioxide, SiN, tantalum oxide or others, in a 50 to 300 nm thickness by CVD, sputtering or other techniques. The gate insulating film 111 may be formed by oxidizing the surfaces of the semiconductor layers 1003, 1004, 1007, 1008.

Then contact holes 1009 and 1010 are formed in the semiconductor layer 1008, and a contact hole 1012 is formed in the scanning line 101. Next a gate electrode 103 is formed of a silicon thin film having added impurities, or is formed of a metal such as Cr, Mo or others. With the gate electrode 103 as the mask, impurities, as of P, B or others, are added with a required energy to the semiconductor layers 1003, 1004, 1007, 1008 by ion implantation, doping or other techniques to form a source region and a drain region by self-alignment. At this time, the impurities can be added to the entire surfaces of the semiconductor layers 1003, 1004, 1007 because the gate electrode as the mask is absent.

Figure 11:
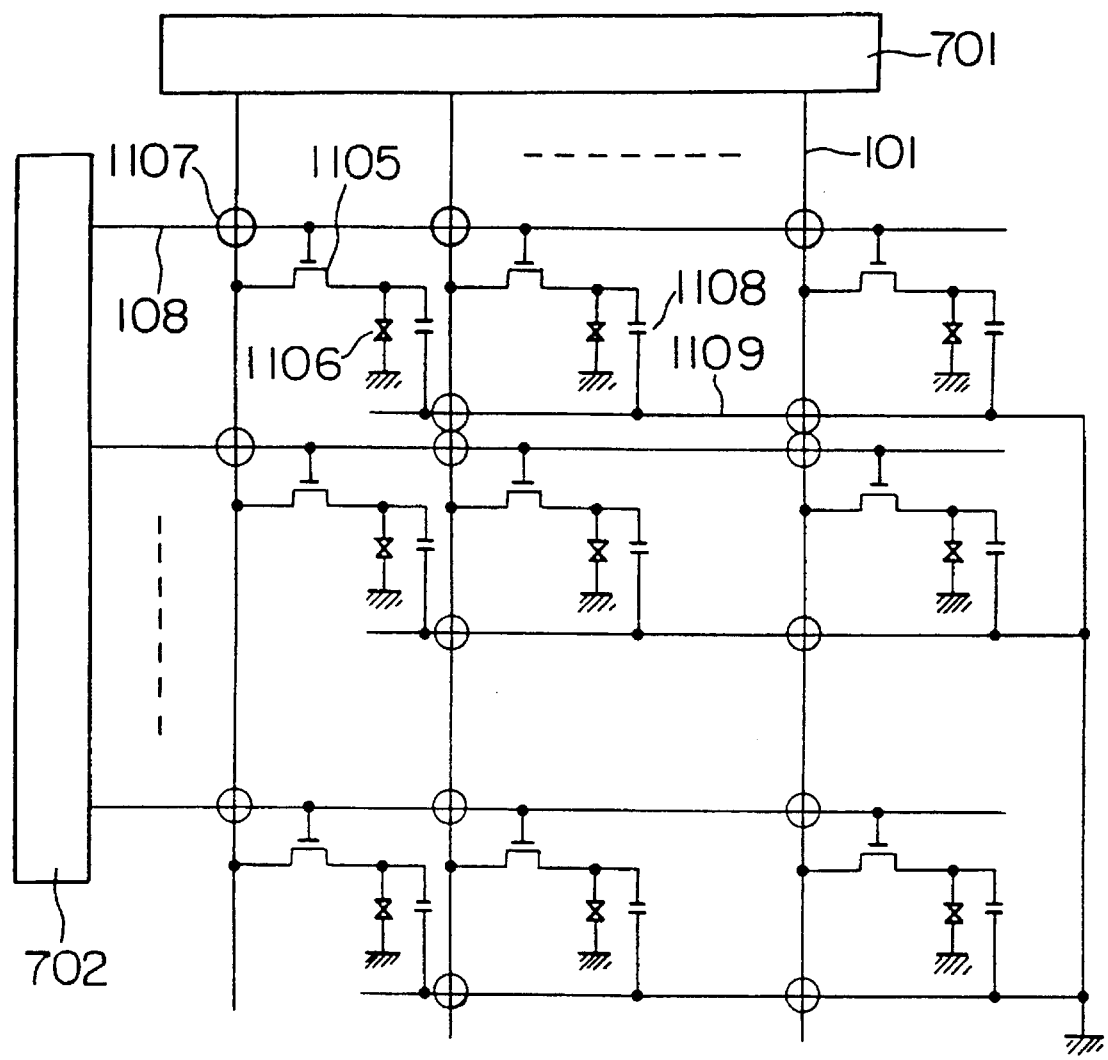
FIG. 11 is a view of an equivalent circuit of the active matrix substrate of FIG. 10.

Next, the impurities added to the semiconductor layers are subjected to heat-treatment to be activated, and a data bus 108 of a metal, transparent conducting film or others, and a pixel electrode 107 are formed. The data bus 108 and the pixel electrode 107 may be concurrently formed of the same material. The thus-prepared active matrix substrate has three-layer structure of the inter-film insulating film 1013, the semiconductor layers 1003, 1004, 1007, and the gate insulating film 111 at the intersection between the holding capacitance line 1002 and the data bus 108, the holding capacitance region constituted by the holding capacity line 1002 and the pixel electrode 107, and the intersection between the scanning line 101 and the data bus 108. Simultaneously a coplanar self-alignment-type thin film transistor having a small parasitic capacity can be obtained. FIG. 11 shows an equivalent circuit of the active matrix substrate of FIG. 11. The holding circuit 701 is connected to the data bus 108, and the scanning circuit 702 is connected to the scanning line 101. A load 1106 is a liquid crystal layer or others. Reference numeral 1107 represents the intersection between the data bus 108, and the scanning line 101 or the holding capacity line 1002. As seen in FIG. 11, the active matrix substrate has many intersections 1107. At the same time, in the active matrix substrate according to this invention, a thin film transistor having intersections which are free from the defect of short-circuits, holding capacitance which are free from the defect of short-circuits, and has a small parasitic capacitance and high performance can be prepared.

FIG. 12 shows the active matrix substrate according to a fourth embodiment of this invention. FIG. 12A is a top view of the active matrix substrate according to the fourth embodiment, FIG. 12B is a sectional view of a holding capacitance region along the line A—A', FIG. 12C is a sectional view of a thin film transistor along the line B—B' in FIG. 12A, and FIG. 12D is a sectional view of an intersection along the line C—C' in FIG. 12A.

Figure 12A:
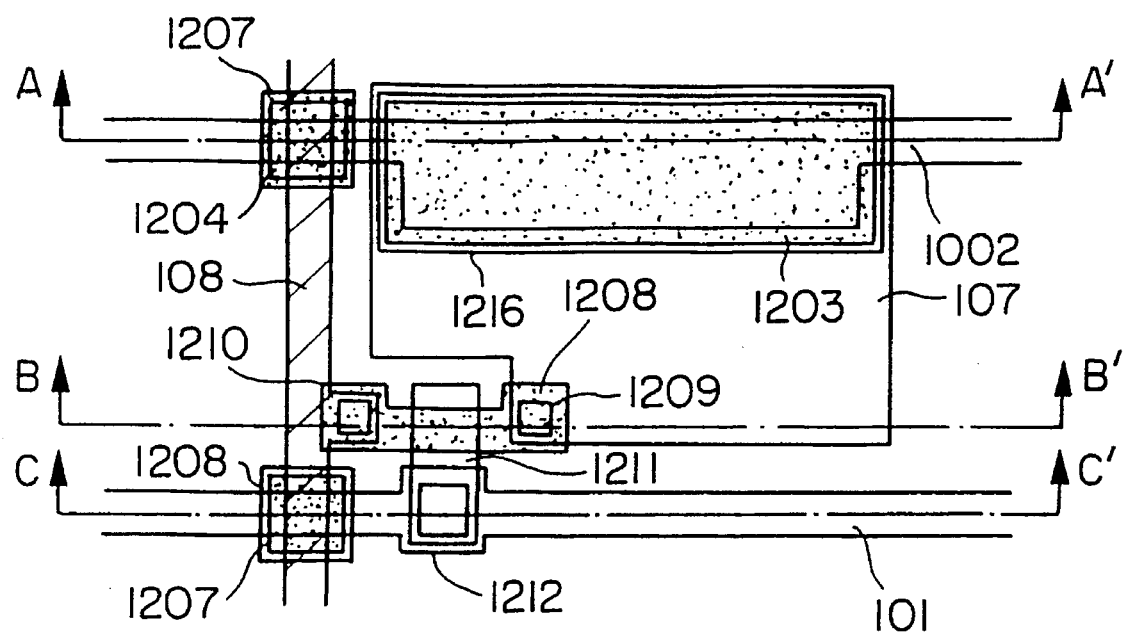
FIGS. 12A, 12B, 12C and 12D are views of the structure of the active matrix substrate according to a fourth embodiment of this invention.
Figure 12B:
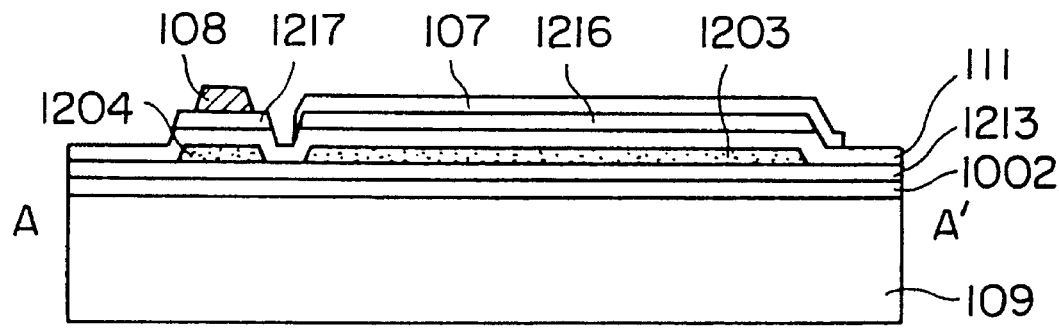
Figure 12C:
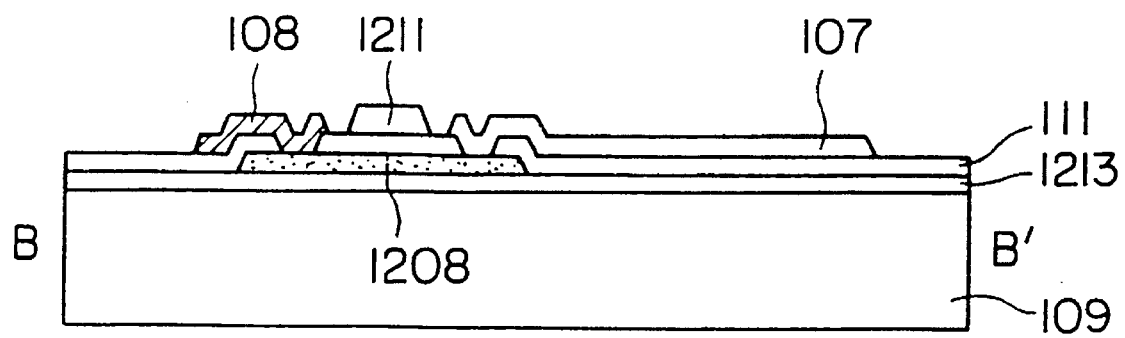
Figure 12D:
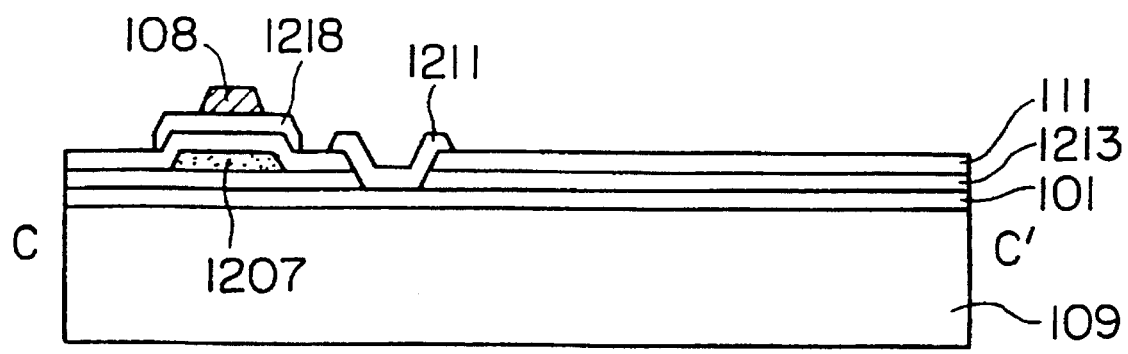

As shown in FIG. 12C, the thin film transistor has completely the same structure as the active matrix substrate of FIG. 10. As shown in FIGS. 12A, B and C, a difference of this active matrix substrate from that of FIG. 12 is that the intersection between a holding capacitance line 1002 and a data bus 108, the holding capacitance region constituted by the holding capacitance line 1002 and a pixel electrode 107, and the intersection between a scanning line 101 and the data bus 108 each have a four-layer structure of an inter-film insulating film 1213, a semiconductor layers 1204, 1203, 1207, a gate insulating film 111, and a gate electrodes 1217; 1216; 1218.

The semiconductor layers 1204, 1203, 1207 in the intersections and the holding capacity region are covered through the gate insulating film 111 respectively by the gate electrodes 1217, 1216, 1218. Accordingly when a source region and a drain regions are formed by adding impurities, such as P, B or others, by ion implantation with the gate electrodes as the masks, the dopant ions are not implanted in the semiconductor layers 1204, 1203, 1207. That is, these semiconductor layers still retain sufficiently high resistance.

Figure 13A:
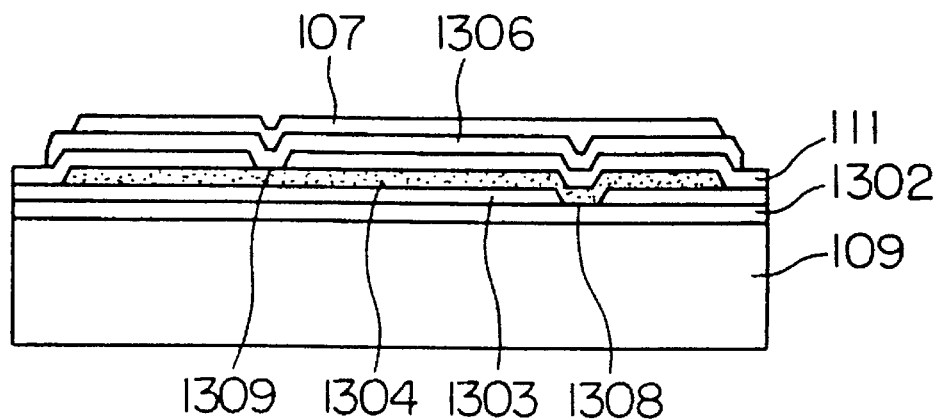
FIGS. 13A and 13B are views of one example of defects of the active matrix substrate of FIG. 12.
Figure 13B:
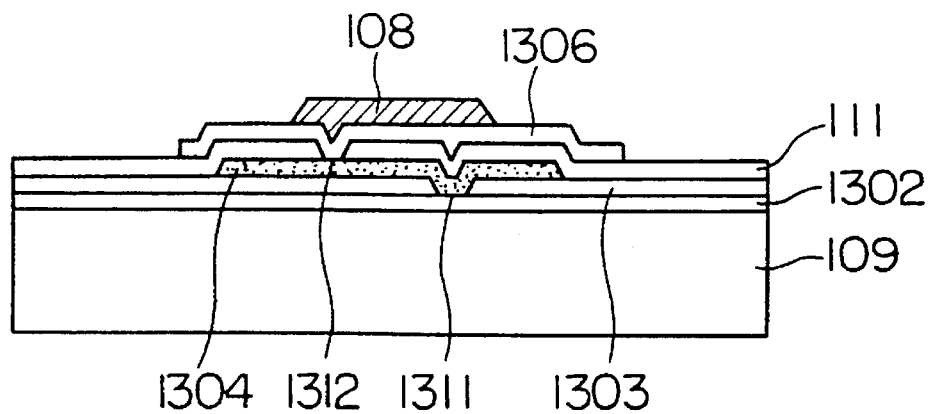

FIG. 13 shows one example of cases that defects take place in the insulating films. FIG. 13A is a sectional view of the holding capacity region constituted by the holding capacitance line 1302 and the pixel electrode 107, and FIG. 13B is a sectional view of the intersection between the holding capacitance line 1302 and the data bus 108. Defects 1308, 1311, such as pin holes, or others, in the inter-film insulating film 1303, defects 1309, 1312, such as pin holes or others, in the gate insulating film 111 are shown. Even when the defects concurrently occur in the inter-film insulating film 1303 and the gate insulating film 111 of both the holding capacitance region and the intersection, because of a sufficiently high resistance of the semiconductor layer 1304, the holding capacitance line 1302 and the pixel electrode 107, and the holding capacitance line 1302 and the data bus 108 are maintained by the high resistance resultantly without short-circuits.

In the structure of the active matrix substrate of FIG. 10, the semiconductor layers 1004, 1003, 1007 have low resistance because of added impurities, such as B, P or others. Consequently when the defects of FIG. 13 occur, short-circuits takes place. As seen in FIG. 12A, since an area of the holding capacitance region is generally larger than that of intersections of lines, especially the structure of this embodiment is effective to the defects in the holding capacitance region. By applying the structure of this embodiment, a defects on the display screen resulting from a defect in the insulating films can be, in principle, totally removed.

Figure 14A:
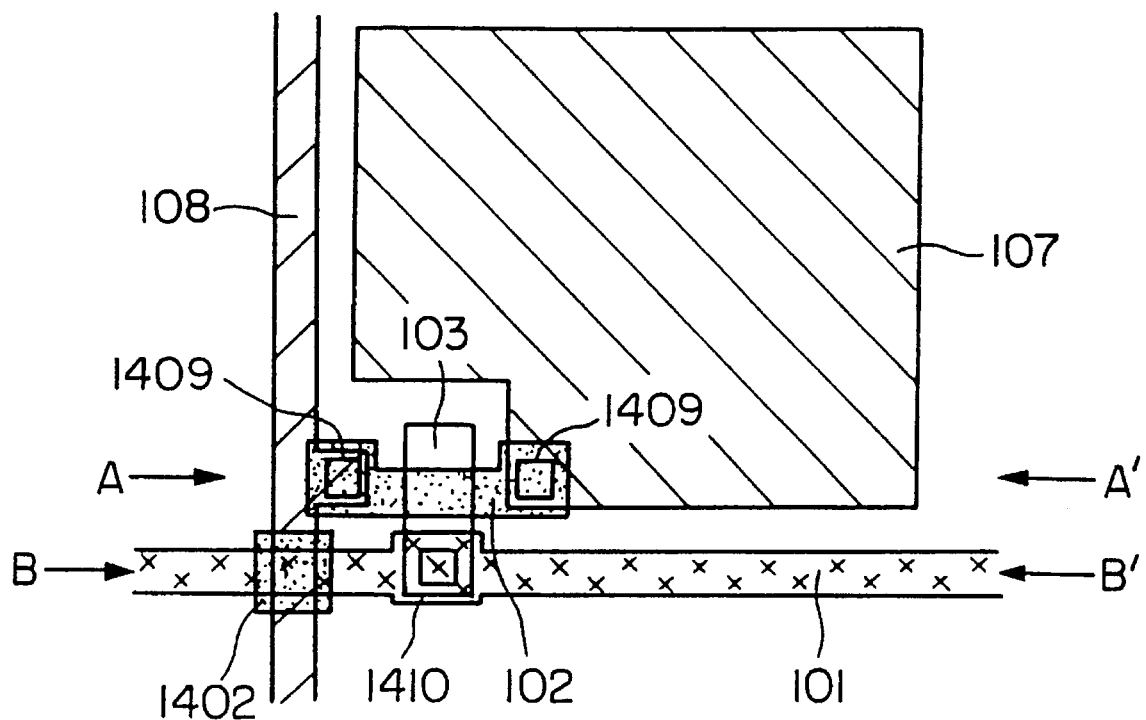
FIGS. 14A, 14B and 14C area views of the structure of the active matrix substrate according to a fifth embodiment of this invention.
Figure 14B:
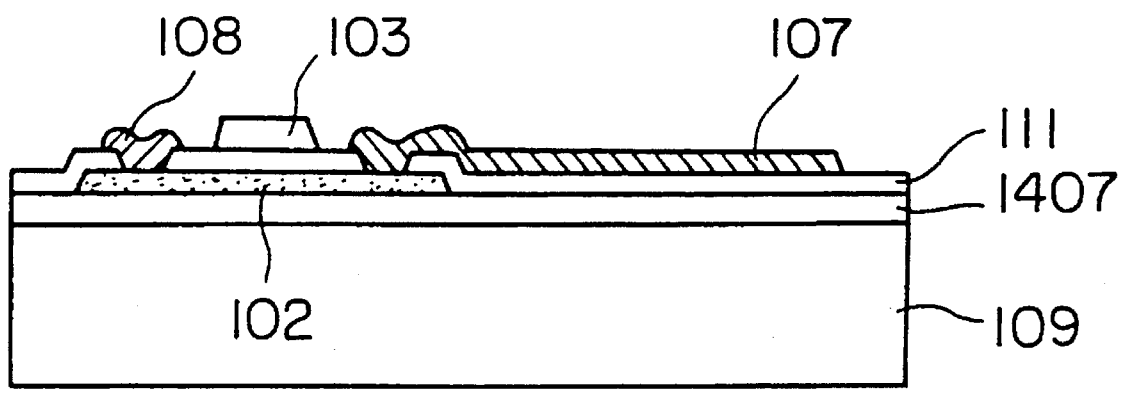
Figure 14C:
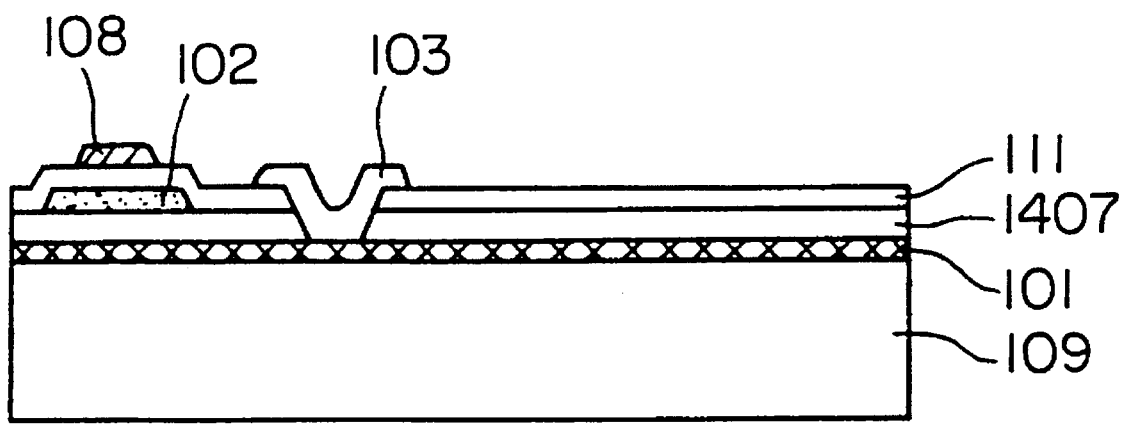

FIG. 14 shows the active matrix substrate according to a fifth embodiment of this invention. FIG. 14A is a top view of this active matrix substrate, FIG. 14B is a sectional view along the line A—A' in FIG. 14A, and FIG. 14C is a sectional view along the line B—B' in FIG. 14A. As described in the above-described embodiments, a scanning line 101 is formed on a substrate 109. Then an inter-film insulating film 1407 is formed of an insulating film, as of silicon dioxide, SiN, tantalum oxide, polyimide resin film or others. Its film thickness is preferably 100 to 1500 nm. A semiconductor layer 102 is formed of a silicon thin film, as of polycrystal silicon, amorphous silicon, or others, is concurrently formed on the active region of a thin film transistor, and the intersection between the scanning line and the data bus 108. Its film thickness is preferably 50 to 300 nm. Subsequently a gate insulating film 111 is formed of an insulating film, as of silicon dioxide, SiN, tantalum oxide or others, in a thickness of 50 to 300 nm. Then a contact hole 1409 and a contact 1410 are formed respectively in the semiconductor layer 102 and the scanning line 101. Next, a gate electrode 103 is formed, and a source region and a drain region are formed by self-alignment by adding impurities, such as P, B or others, to the semiconductor layer 102 by ion implantation or other techniques.

Finally, a data bus 108 is formed of a metal, a transparent conducting film or others, and a pixel electrode 107 is formed of a transparent conducting film or others. The data bus 108 and the pixel electrode 107 may be concurrently formed of the same material. The thus-prepared active matrix substrate has the three layer-structure of the inter-film insulating film 1407, the semiconductor layer 102 having impurities added by ion implantation or other techniques, and the gate insulating film 111 at the intersection between the scanning line 101 and the data bus 108. At the same time, a coplanar self-alignment type thin film transistor having a small parasitic capacitance can be realized. FIG. 15 shows the active matrix substrate according to a sixth embodiment of this invention.

Figure 15A:
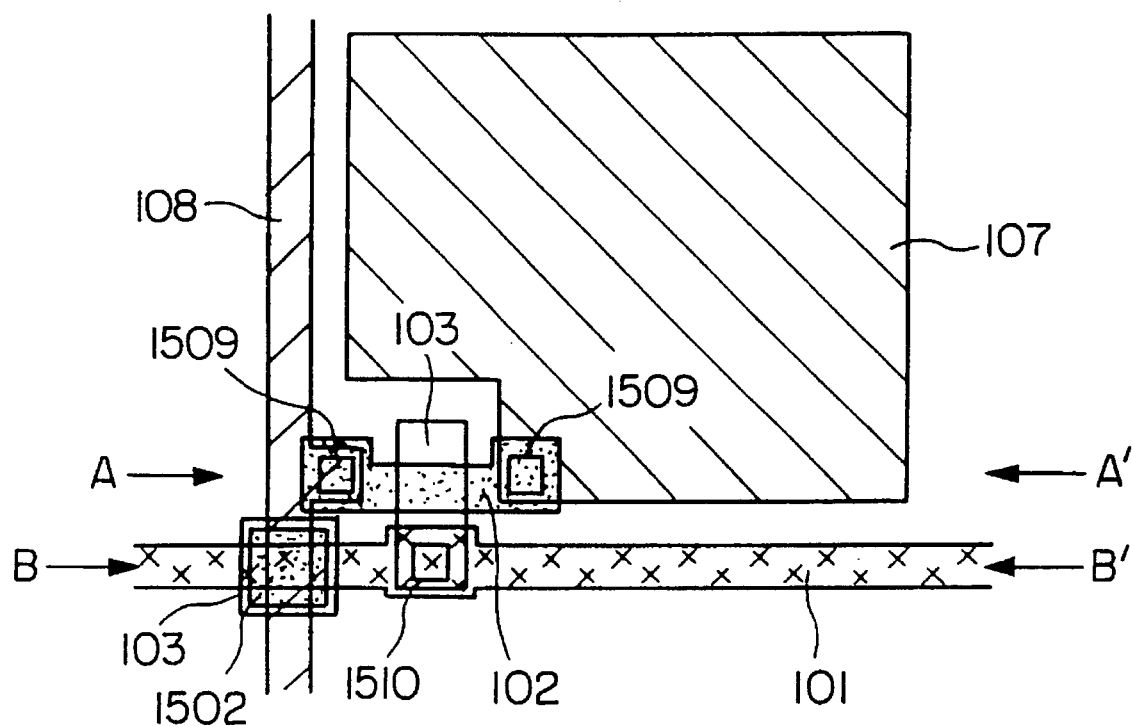
FIGS. 15A, 15B and 15C are views of the structure of the active matrix substrate according to a sixth embodiment of this invention.
Figure 15B:
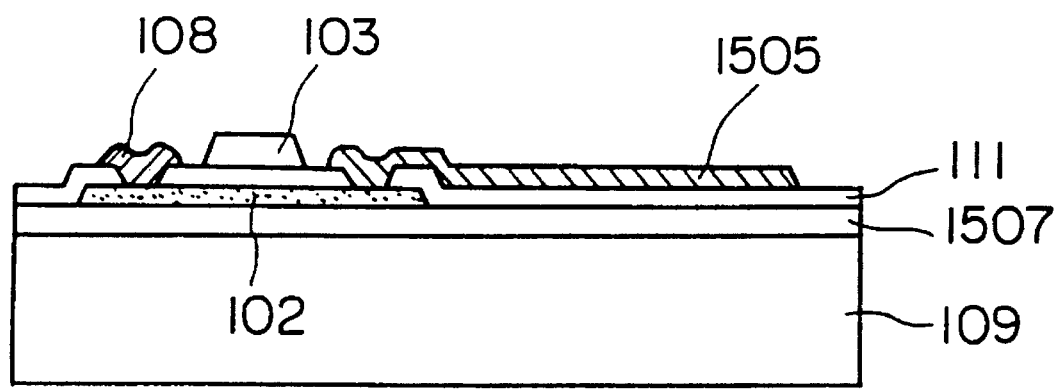
Figure 15C:
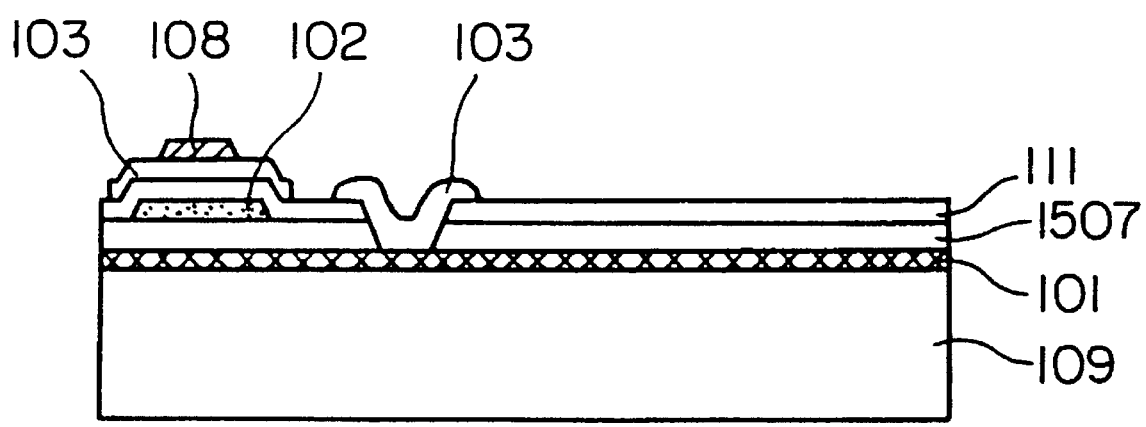

FIG. 15A is a top view of the active matrix substrate according to the sixth embodiment of this invention, FIG. 15B is a sectional view of a thin film transistor along the line A—A', and FIG. 15C is a sectional view of the intersection between a scanning line 101 and a data bus 108 along the line B—B' in FIG. 5A.

As shown in FIG. 15B, a thin film transistor region has the same structure as the active matrix substrate of FIG. 14. The difference of the active matrix substrate according to this embodiment from that of FIG. 14 is that, as seen in FIGS. 15A and C, the intersection between a scanning line 101 and a data bus 108 has the four-layer structure of an inter-film insulating film 1507, a semiconductor layer 102, a gate insulating film 111, and a gate electrode 103. Since the semiconductor layer 102 at the intersection is covered with the gate electrode 103 through a gate insulating film 111, the semiconductor layer 102 at the intersection still retains high resistance after the addition of impurities by ion implantation or other techniques.

Figure 16:
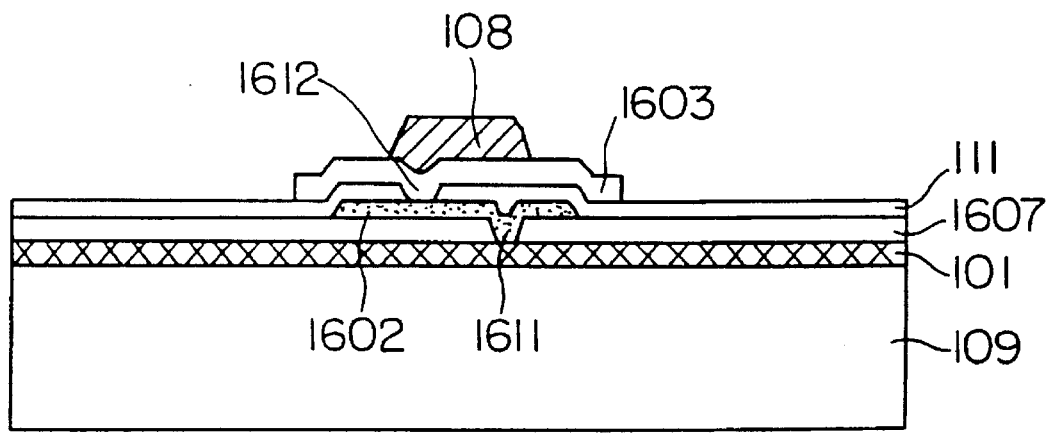
FIG. 16 is a view of one example of defects of the active matrix substrate of FIG. 15.

FIG. 16 shows one example of cases that a defect occurs in an intersection. In this example, a pin hole 1611 takes place in the inter-film insulating film 1607, and a pin hole 1612 occurs in the gate insulating film 111. Although the pin holes concurrently occur in the same intersection, because of sufficiently high resistance of the semiconductor layer 1602, the scanning line 101 and the data bus 108 do not short-circuit. In the intersection of the structure of the active matrix substrate of FIG. 14, the semiconductor 102 has low resistance by the addition of impurities. Consequently when pin holes concurrently occur in the insulating film of the same intersection as shown in FIG. 16, short-circuit takes place. But in the structure of FIG. 15, the short-circuiting in the intersection is perfectly eliminated.

Figure 17A:
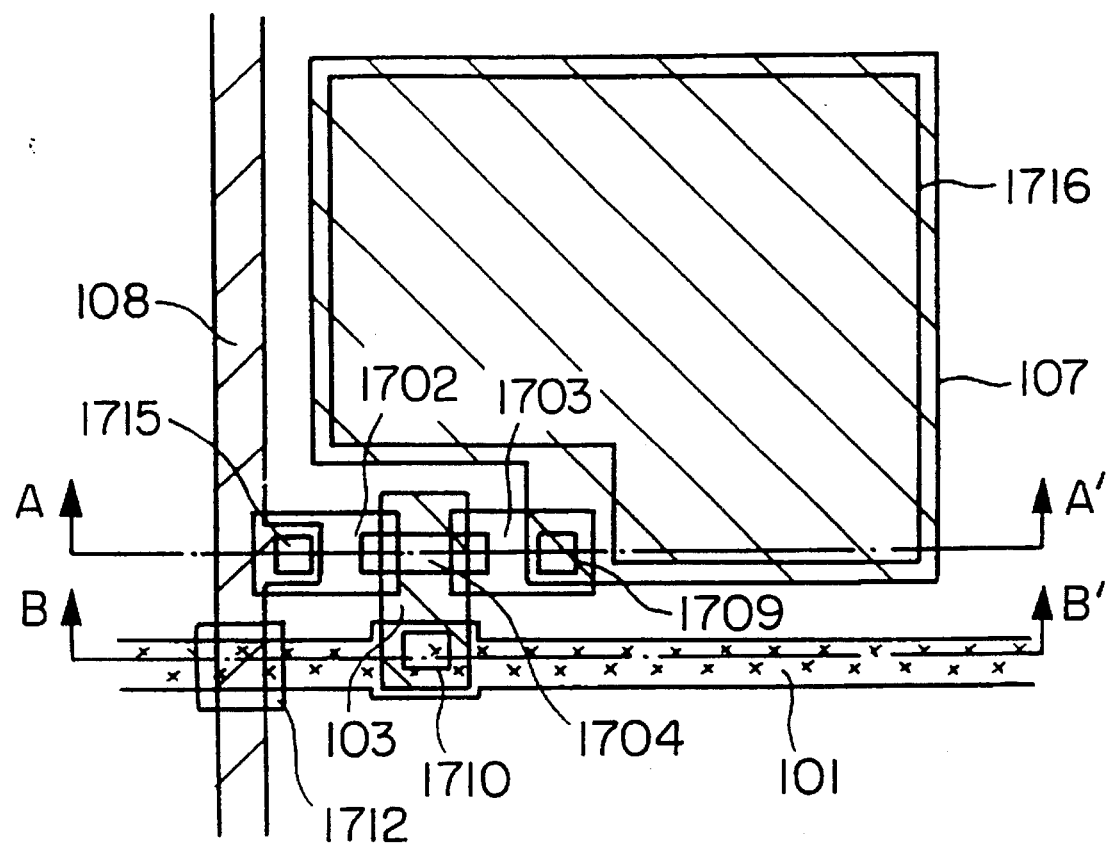
FIGS. 17A, 17B and 17C are views of the structure of the active matrix substrate according to a seventh embodiment of this invention.
Figure 17B:
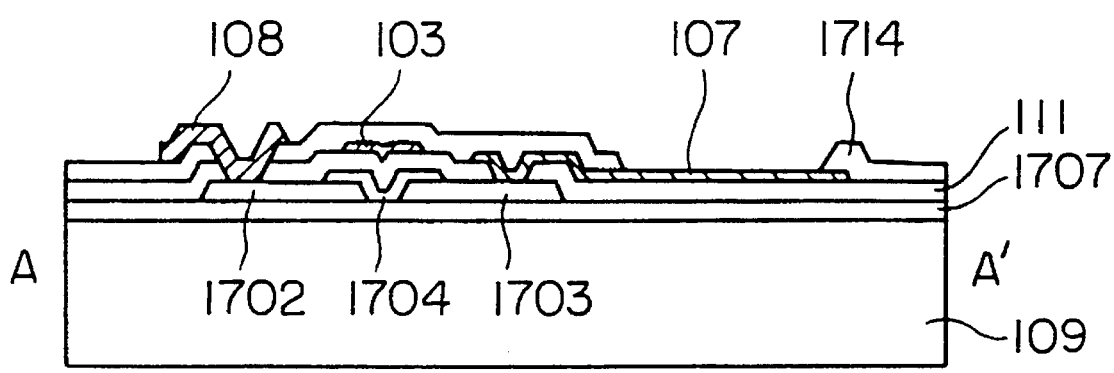
Figure 17C:
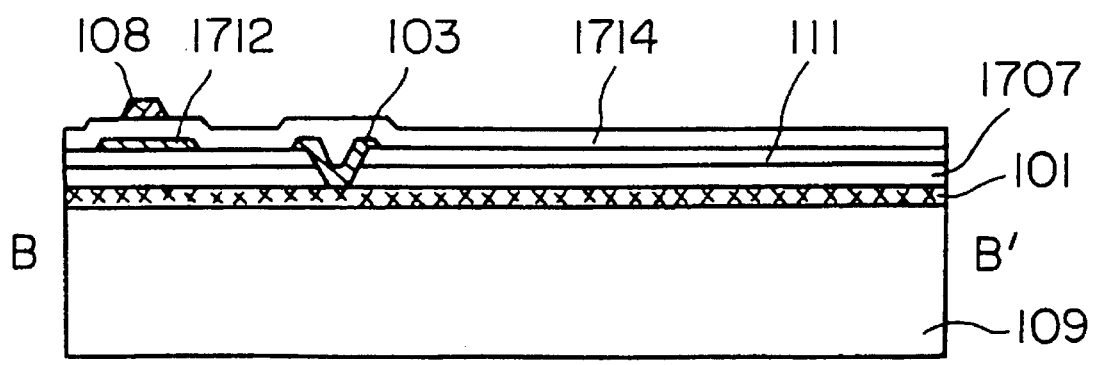

FIG. 17 shows the active matrix substrate according to a seventh embodiment of this invention. FIG. 17A is a top view of the active matrix substrate according to the seventh embodiment, FIG. 17B is a sectional view along the line A—A', and FIG. 17C is a sectional view along the line B—B' in FIG. 17A. As in the above-described embodiments, a scanning line 101 is formed on a substrate 109. Then a first inter-film insulating film 1707 is formed of a insulating film, as of silicon dioxide, SiN, tantalum oxide, polyimide resin film or others. Its film thickness is preferably 100 to 1500 nm. Subsequently a source region 1702 and a drain region 1703 are formed of a silicon thin film, as of polycrystal silicon, amorphous silicon or others, having impurities added as donors or acceptors. A semiconductor layer 1704 is formed of a silicon thin film, as of polycrystal silicon, amorphous silicon or others, to bridge the source region 1702 and the drain region 1703 at the upper sides thereof.

Subsequently a gate insulating film 111 is formed of an insulating film, as of silicon dioxide, SiN, tantalum oxide or others, in a thickness of 50 to 300 nm. Then a contact hole 1709 is formed in the drain region 1703, and a contact hole 1710 is formed in the scanning line 101. Next a pixel electrode 107 is formed, and at the same time of forming the gate electrode 103, an electrode 1712 for the intersection between the scanning line 101 and the data bus 108 is formed. Subsequently a second inter-film insulating film 1714 is formed of an insulating film, as of silicon dioxide, SiN, polyimide or others. Its film thickness is preferably 100 to 1500 nm.

Then a contact hole 1715 is formed in the source region 1702, and a window 1716 is formed in the pixel electrode 107. Finally a data bus 108 is formed. The thus-prepared active matrix substrate has at an intersection between the scanning line 101 and the data bus 108 the four-layer structure of the first inter-film insulating film 1707, the gate insulating film 111, the intersection electrode 1712 and the second inter-film insulating film 1714. Consequently even when defects, such as pin holes, occur in the insulating film of the intersection, no short-circuit occurs in principle.

Figure 18:
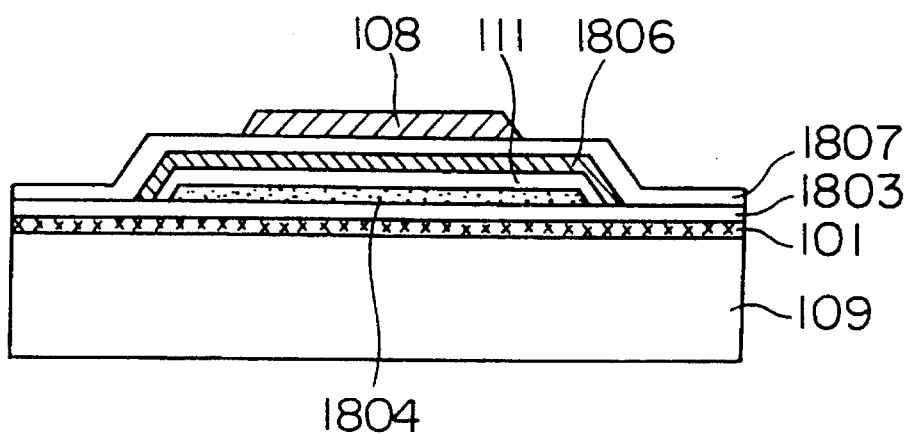
FIG. 18 is a view of the active matrix substrate according to this invention.

In the embodiment of FIG. 17, the intersection electrode 1712 is formed at the intersection between the gate electrode 103 and the pixel electrode 107 at the same time of forming the gate electrode 103 and the pixel electrode 107. But it is possible to provide the drain electrode 1703 and the semiconductor layer 1704, or a layer combining both. It is effective to provide a semiconductor layer 1804 (see FIG. 18) at the intersection between the scanning line 101 and the data bus 108 especially in the case that the gate insulating film 111 is formed by oxidizing the surface of the silicon thin film of the drain electrode 1703 or of the semiconductor layer 1804.

Figure 19A:
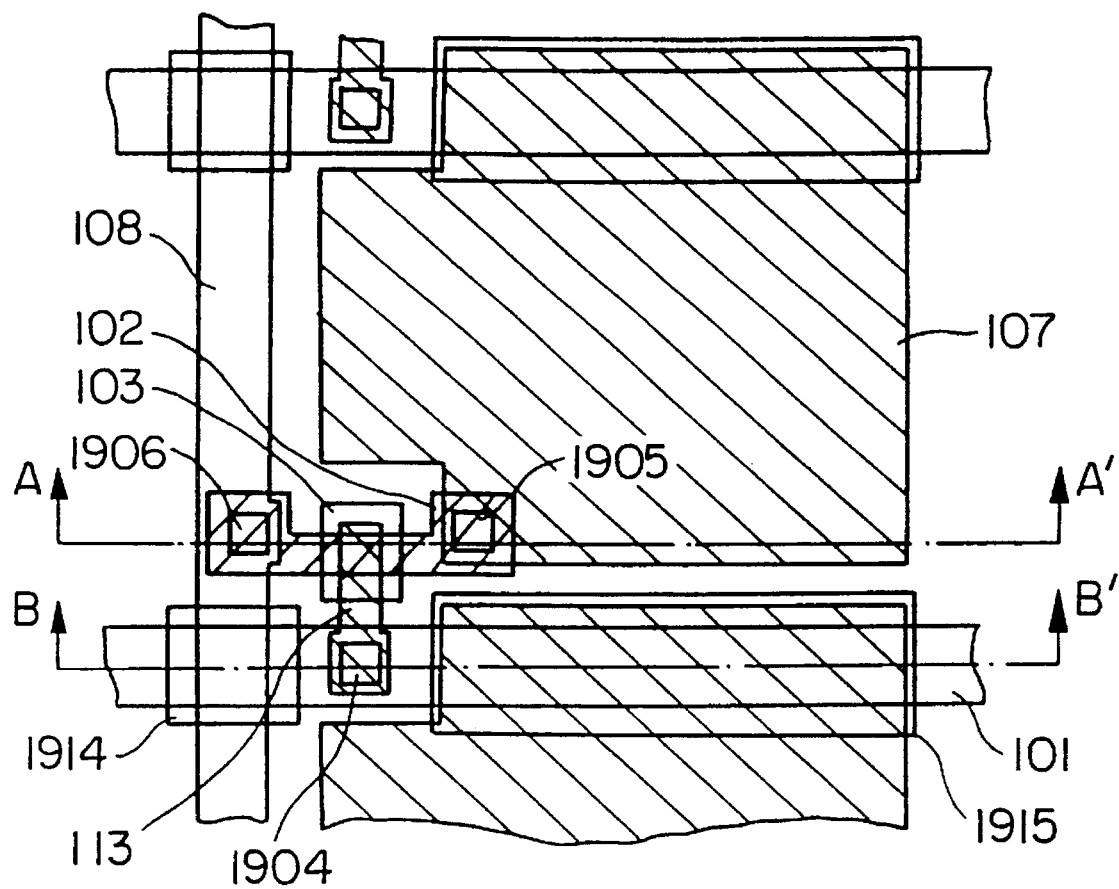
FIGS. 19A, 19B and 19C are views of the structure of the active matrix substrate according to an eighth embodiment of this invention.
Figure 19B:
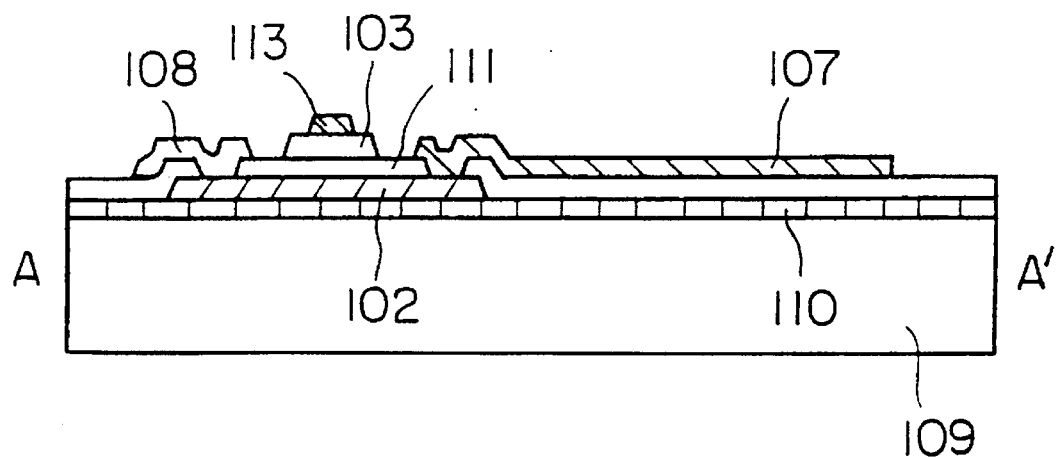
Figure 19C:
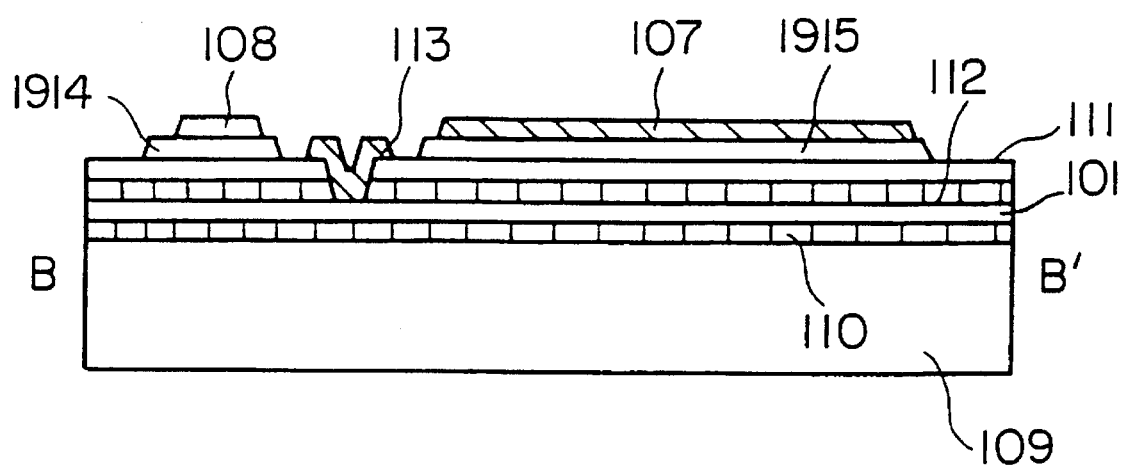

FIG. 19 shows the active matrix substrate according to an eighth embodiment of this invention. FIG. 19A is a top view of the active matrix substrate according to the eighth embodiment of this invention, FIG. 19B is a sectional view along the line A—A' in FIG. 19A, and FIG. 19C is a sectional view along the line B—B' in FIG. 19A. A protective insulating film 110 is formed of tantalum oxide on a substrate 109, and then a scanning line 101 of tantalum covered with tantalum oxide 112 is formed thereon.

Subsequently a semiconductor layer 102 constituting a thin film transistor is formed of polycrystal silicon in a thickness of 25 nm. The material of the protective insulating film 110 is not essentially tantalum-based as long as it can be easily thermal-oxidized at a temperature below 500° C., which is the polycrystal silicon forming temperature and below the heat-resistance temperature of a substrate. It is preferable that the material of the scanning line can be easily thermal-oxidized at the surface by anode oxidation or thermal oxidation, and has a heat resistance temperature above 800° C. In addition to tantalum-based materials, niobium-based materials, for example, can be used without any problem as the tantalum-based materials can be. A contact hole 1904 is formed in the tantalum oxide covering the scanning line 101. The tantalum oxide film 112 can be easily removed by dry etching using a mixed gas of $CF_4$ and oxygen gas. But because the etching ratio of the tantalum oxide film 112 to the tantalum forming the scanning line 101 cannot be large, the etching time is administered to form the contact hole 1904. Accordingly it is preferable that a thickness of the tantalum oxide, and that of the tantalum film satisfy Tantalum film thickness $\geq$ Tantalum oxide film thickness.

Then a gate insulating film 111 is formed of silicon dioxide in a 150 nm-thickness by ECR plasma CVD. Next a gate electrode 103 is formed of conducting silicon film with phosphorus in a 300 to 500 nm thickness. At the same time, an electrode 1914, and an electrode 1915 are formed of the same material respectively at the intersection between the scanning line 101 and the data bus 108, and a holding capacity region constituted by the scanning line 101 and the pixel electrode 107.

Subsequently phosphorus ions are added to the semiconductor layer 102 through the gate insulating film 111 by ion implantation with the gate electrode 103 as the mask to form a source region and a drain region by self-alignment. The electrodes 1914, 1915 respectively hinder the phosphorus ions from being implanted in the tantalum oxide of the intersection and the holding capacitance region. If impurities, such as phosphorus ions, boron ions others, are implanted in the tantalum oxide, energy levels are set up with the result that the insulativity of the tantalum oxide is adversely lowered.

Next by activating the implanted ions by the radiation of excimer laser and reducing the resistance of the silicon layer of the source region and the drain region, contact holes 1904, 1905, 1908, and the gate insulating film 111 are opened by etching using the mixed liquid of hydrogen fluoride and ammonium fluoride. Then a pixel electrode 107 is formed of ITO film in a 30 to 200 nm-thickness so as to partially cover the scanning line 101. Then at the same time a gate line 113 is formed of ITO film so as to connect the contact hole 1904 in the scanning line 101, and the gate electrode 103. At this time the gate line 113 is formed so as to be thinner than a width of the gate electrode 103, i.e., a channel length of the thin film transistor, at the intersection between the semiconductor layer 102 and the gate electrode 103. This is for prohibiting the gate line 113 from superposing on the source region or the drain region with the adverse result of increased parasitic capacitance. Finally a data bus 108 is formed of alloy of aluminum and silicon in a thickness of 500 to 800 nm.

The thus-prepared active matrix substrate has the three-layer structure of the tantalum oxide film 112, the gate insulating film 111, and an electrode of the same material as the gate electrode 103 at the intersection between the scanning line 101 and the data bus 108, and in the insulating layer of the holding capacitance region constituted by the pixel electrode 107 formed so as to partially cover the scanning line. Concurrently a coplanar self-alignment type thin film transistor having a small parasitic capacitance can be realized. The thin film transistor has a driving power high enough to drive a liquid crystal layer even with a small channel width W of the thin film transistor because the semiconductor layer constituting the active region of the thin film transistor is formed of polycrystal silicon having a mobility as high as 10 to 100 $cm^2/V \cdot S$. With a thin film transistor having a 2 μm-channel length and a 2 μm-channel width can reserve a sufficient electric energy in the liquid crystal layer. Consequently the capacitance of the thin film transistor can be diminished, and a liquid crystal display having sufficiently high picture quality even with a small holding capacitance can be realized.

Furthermore, the insulating film forming the holding capacitance region has the two-layer structure of a thin silicon dioxide film (thickness: 150 nm) and the tantalum oxide of a high relative dielectric constant (relative dielectric constant: 25 to 28), and consequently a large capacitance can be obtained with a small area. As a result, the aperture ratio can be high. The insulating film has the two-layer structure of silicon dioxide and tantalum oxide both at the intersection between the scanning line 101 and the data bus 108, and the holding capacitance region. Even when pin holes occur in either of the layers, short-circuiting does not take place. Even if the silicon dioxide of the intersection or the holding capacitance region is etched due to pin holes in a photoresist for opening the contact holes 1905, 1906, tantalum oxide cannot be etched with mixed liquid of hydrogen fluoride and ammonium fluoride. The insulation is sufficiently secured, and the short-circuiting never take place.

Figure 20:
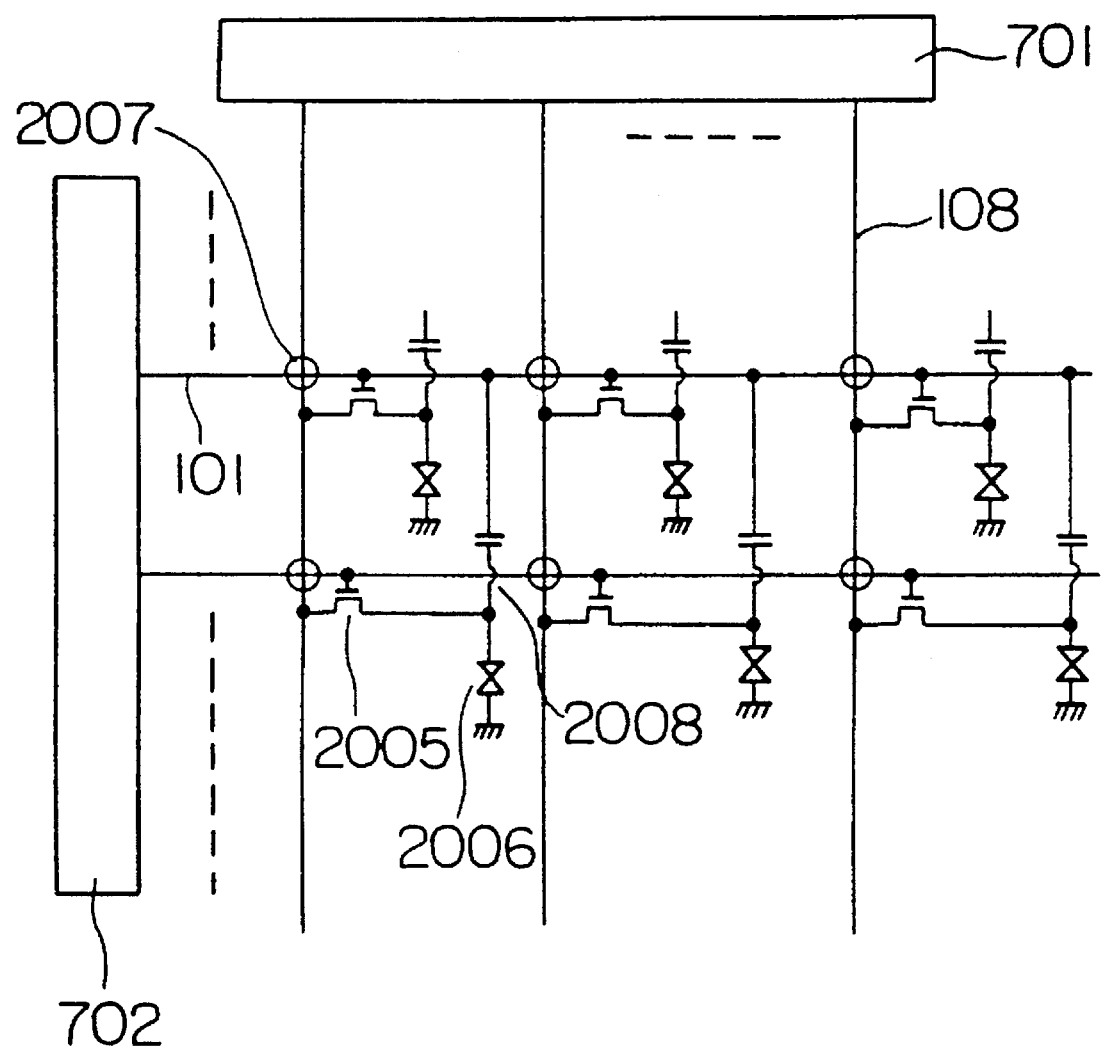
FIG. 20 is a view of an equivalent circuit of the active matrix substrate of FIG. 19.

FIG. 20 shows an equivalent circuit of the active matrix substrate of FIG. 19. A holding circuit 701 and a scanning circuit 702 are connected to the data bus 106 and the scanning line 101. A load 2006 is, e.g., a liquid crystal. As seen in FIG. 20, a number of the data bus × a number of the scanning line of the intersection 2007 are present on a sheet of substrate 190. Holding capacitance 2008 are provided in one vs. one correspondence to pixel electrodes. A short-circuit in the insulating films of the intersection and the holding capacitance layer result in line defects and pixel defects on the display screen. How to decrease this short-circuiting defect is a problem, while increases of the aperture ratio and contrast ratio, and bright picture quality are essential to the liquid crystal display. This problem can be solved at once by the use of the active matrix substrate of FIG. 19.

Figure 21:
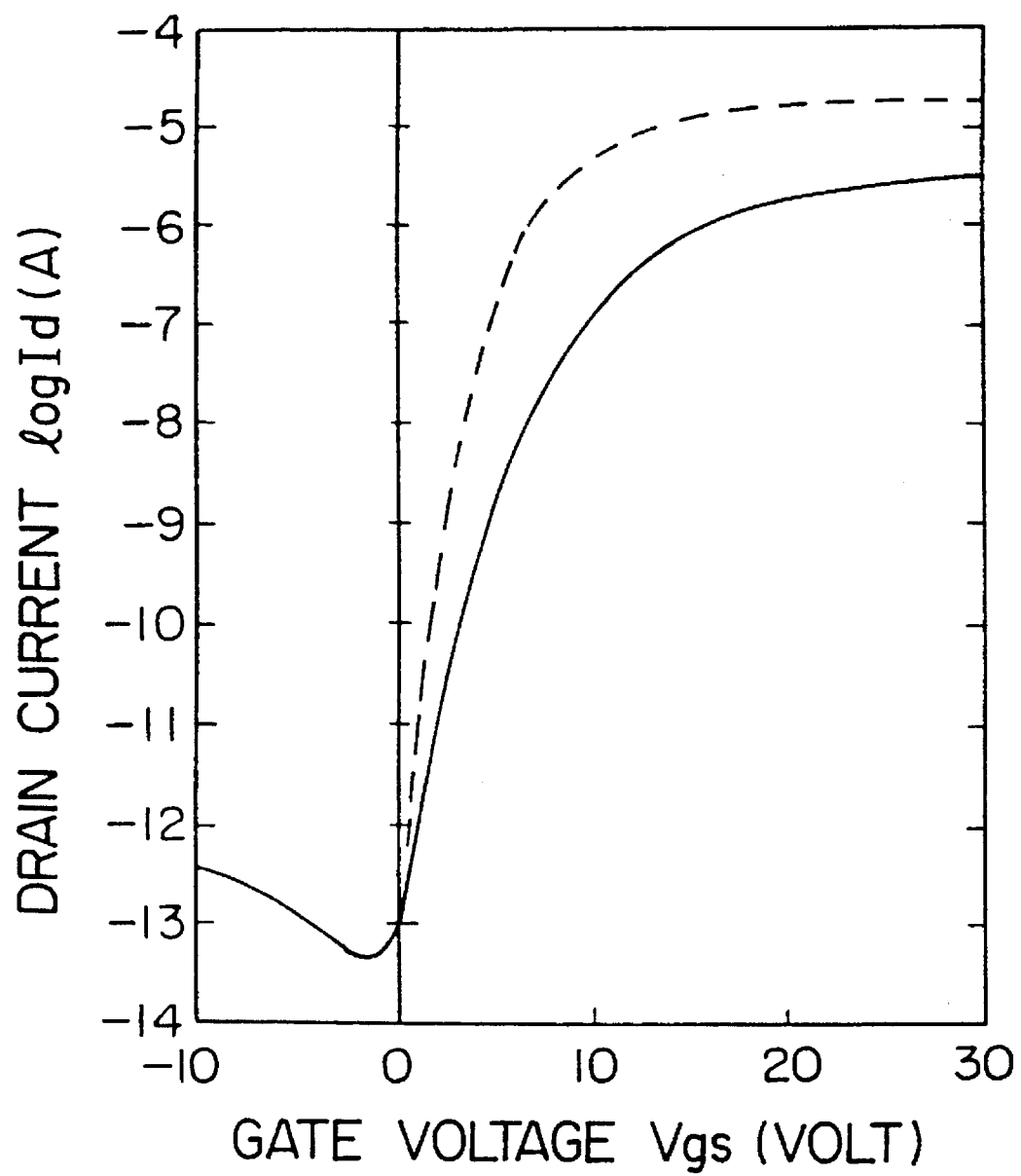
FIG. 21 is a view of characteristics of polycrystal thin film transistors.

FIG. 21 shows typical characteristics of the above-described thin film transistors formed of polycrystal silicon.

The horizontal axis takes gate electrodes Vgs, and the vertical axis takes logarithmic values of drain currents Id. The drain-source voltages Vd is 4 (V), the channel length is 20 μm, and the channel width is 10 μm. The characteristic indicated by the solid line is for the thin film transistors of polycrystal silicon formed on tantalum oxide, and the broken line is for the thin film transistor of polycrystal silicon formed on silicon dioxide. As seen from these characteristics, the polycrystal silicon formed on tantalum oxide is superior to that formed on silicon dioxide, and the former can form a thin film transistor having a high on-off ratio and high performance can be realized. The active matrix substrate of FIG. 19 makes it possible to fabricate a thin film transistor which enjoys high performance.

Figure 22A:
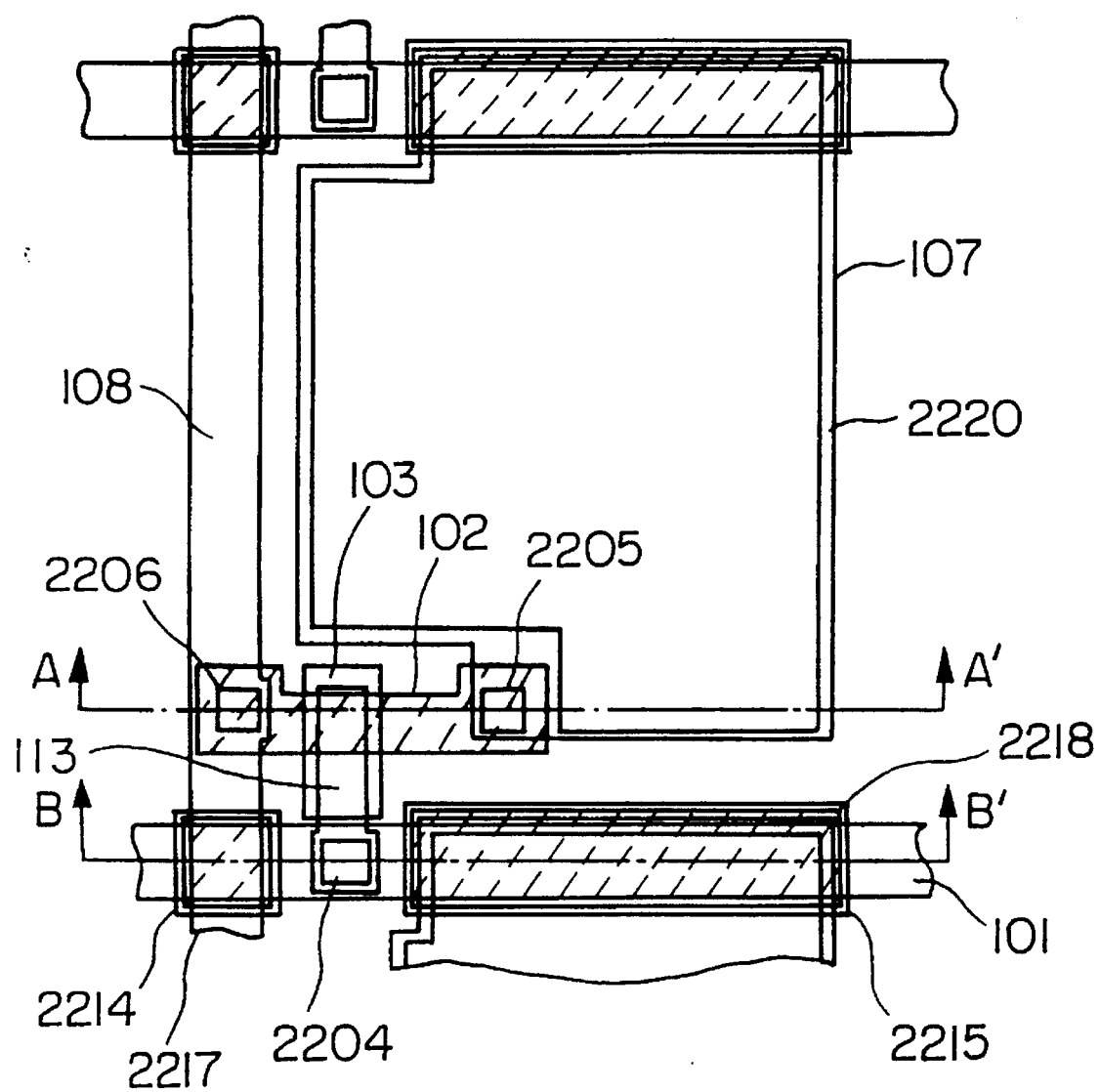
FIGS. 22A, 22B and 22C are views of the structure of the active matrix substrate according to a ninth embodiment of this invention.
Figure 22B:
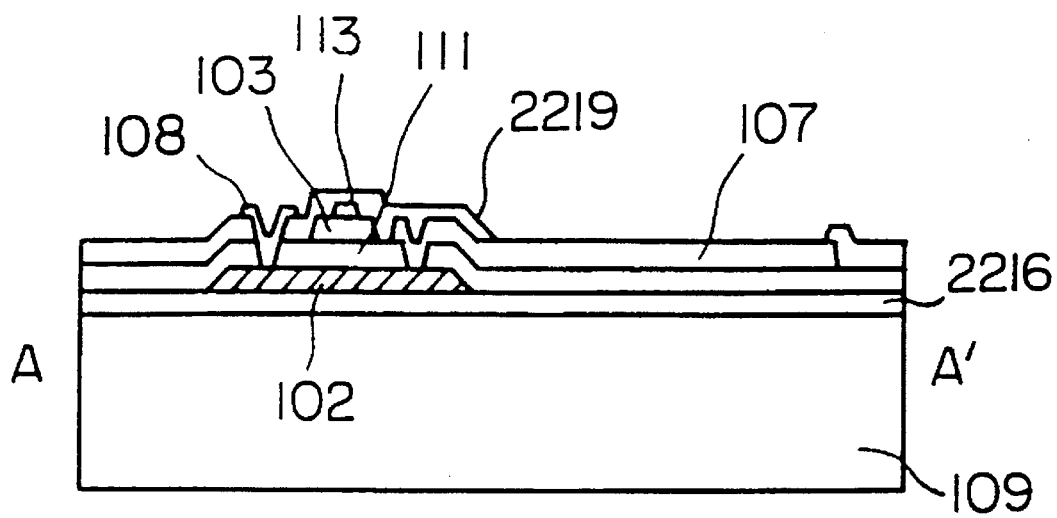
Figure 22C:
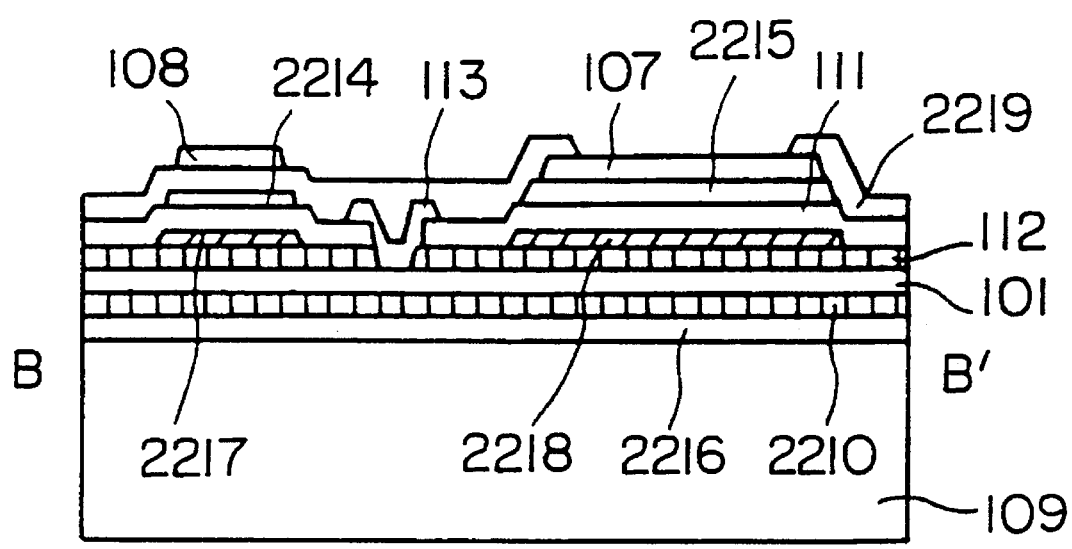

FIG. 22 shows the active matrix substrate according to a ninth embodiment of this invention. FIG. 22A is a top view of the active matrix substrate according to a ninth embodiment of this invention, FIG. 22B is a sectional view of a thin film transistor along the line A—A' in FIG. 22A, and FIG. 22C is a sectional view of the intersection between a scanning line and a data bus along the line B—B' in FIG. 22A. A first protective insulating film 2216 is formed of silicon dioxide on a glass substrate 109 in a 200 to 300 nm thickness by normal pressure CVD. The forming technique may be spattering or ECR plasma CVD.

Next a second protective insulating film 2210 is formed of tantalum oxide, and then a scanning line 101 of tantalum covered with tantalum oxide film 112 is formed thereon. The tantalum oxide forming the second protective insulating film 2210 is prepared by forming tantalum in a thickness of 50 to 200 nm by sputtering and leaving the same for 1 to 2 hours in an ambient atmosphere containing 500° C. oxygen for heat oxidation. The scanning line 101 is prepared by forming tantalum in a 30 to 500 nm thickness by sputtering and processing the same into the shape in FIG. 22 by photolithography and dry etching. The used dry-etching device comprises a plasma chamber for decomposing the mixed gas of felon 14 and oxygen gases by plasma and generating radicals contributing to the etching, and an etching chamber separately provided for transferring generated radicals and etching. The etching speed of tantalum is substantially the same as that of tantalum oxide, and the etching speed of silicon dioxide is below 1/20 that of tantalum oxide.

The scanning line 101 of tantalum, and the second protective insulating film 2210 of tantalum oxide are continuously etched by this technique to obtain a structure in which the first protective insulating film 2216 of silicon dioxide is completely exposed. As a result the second protective insulating film 2210 is left only below the scanning line 101, which serves to increase the contact between the silicon dioxide forming the first protective insulating film 2216 and the scanning line 101 of tantalum. The protective film for preventing the diffusion of the impurities of the substrate 109.

Next the surface of the scanning line 101 is subjected to anode oxidation in aqueous solution of 0.01 wt % citric acid at 100 V to form tantalum oxide in a thickness of about 150 to 200 nm which provide a semiconductor layer 102 constituting the active region of a thin film transistor. At the same time semiconductor layers are formed, as shown in FIG. 22, also at the intersection between 2217 between the scanning line 101 and the data bus 108, and at a holding capacity region 2218 constituted by the scanning line 101 and a pixel electrode 107. These semiconductor layers are formed in a thickness of about 25 nm, but the technique for forming polycrystal silicon forming these semiconductor layers is the same as in the previous embodiments. Then a contact hole 2204 is formed in the tantalum oxide layer 112 provided in such a manner as to cover the scanning line 101. The tantalum oxide layer 112 can be easily etched by dry etching using mixed gas of freon gas 14 and oxygen gas. But the contact hole 2204 must be opened by administering the etching time because the etching selection ratio of the tantalum to the tantalum oxide cannot be high. Accordingly it is preferable that the thickness of the tantalum oxide and that of tantalum satisfy Tantalum film thickness ≧ tantalum oxide film thickness Subsequently a gate insulating film 111 is formed of silicon dioxide in a thickness of 150 nm by ECR plasma CVD. The silicon dioxide formed by ECR plasma CVD is as good as silicon heat-oxidized film which is dense and has little traps, and can be obtained at a temperature below 100° C. The silicon dioxide is most suitable for the gate insulating film 111. Next a gate electrode 103 is formed of conducting silicon film having phosphorus added in a thickness of 300 to 500 nm by low pressure CVD. Then with the gate electrode 103 as a mask, phosphorus ions are added to the semiconductor layer 102 by ion implantation with 120 eV energy at a concentration of $3 \times 10^{15}$ ($1/cm^2$) to form a source region and a drain region by self-alignment. Excimer laser is radiated to the source and the drain regions to activate the implanted ions and make the silicon layer of the source and the drain regions less resistive. At this time, electrodes 2214, 2215 of the same material as the gate electrode 103 are formed to completely cover the semiconductor layer 2217 left at the intersection, and the semiconductor layer 2218 at the holding capacity region with larger areas for preventing the implantation of the phosphorus ions in the semiconductor layers 2217; 2218 and the resultant reduction of their resistance.

Subsequently the gate insulating film 111 is etched with mixed liquid of hydrogen fluoride and ammonium fluoride to open contact holes 2204, 2205, 2206, and picture element electrode 107 is formed of ITO film in a 30 to 200 nm thickness to partially cover the scanning line 101 and constitute a holding capacity. At the same time, a gate line 113 is formed of ITO film to connect the contact hole 2204 and the gate electrode 103. At this time the gate line 113 is formed so as to be thinner than a width of the gate electrode 103, i.e., a channel length L of the thin film transistor. A third protective insulating film 2219 is formed of silicon dioxide in a thickness of 200 to 1000 nm. At the same time a contact hole 2206, and a window 2220 on a pixel electrode 107 are opened, and finally a data bus 108 is formed of Al.

In the thus-prepared active matrix substrate the insulation of the intersection between the scanning line 101 and the data bus 108 is provided by the five-layer structure of the tantalum oxide 112, the polycrystal silicon of high resistance 2217, the gate insulating film 111, the electrode 2214 formed concurrently with the gate electrode 103, the third protective insulating film 2219. Consequently no short-circuit between the scanning line 101 and the data bus 108 takes place. The insulation of the holding capacity region constituted by the scanning line 101 and the pixel electrode 107 is provided by the three-layer structure of the tantalum oxide 112, the semiconductor layer 2218 of high-resistance polycrystal silicon, and the gate insulating film. No short-circuit takes place unless a defect, such as a pin hole, occurs concurrently at identical positions of the respective layers.

Because the thin film transistor is of coplanar self-alignment type and has a small parasitic capacitance and the semiconductor layer forming the active region of the thin film transistor is formed of polycrytal silicon having a mobility as high as 10 to 100 cm$^2$/V·S, a sufficient driving power to drive the liquid crystal layer can be obtained even with a small width of the channel of the thin film transistor. The thin film transistor having a 2 μm-channel length and a 2 μm-channel width can accumulate an electric charge for the liquid crystal layer. Consequently the capacitance of the thin film transistor can be small-sized, and even with a small holding capacitance a liquid crystal display of sufficiently high picture quality can be realized. Furthermore, the insulating layer constituting the holding capacitance region has the two-layer structure of the silicon dioxide film (film thickness: 150 nm), and the tantalum film of a large relative dielectric constant (relative dielectric constant: 25 to 28). A large capacitance can be realized with a small area, and resultantly the aperture ratio can be high.

Figure 23A:
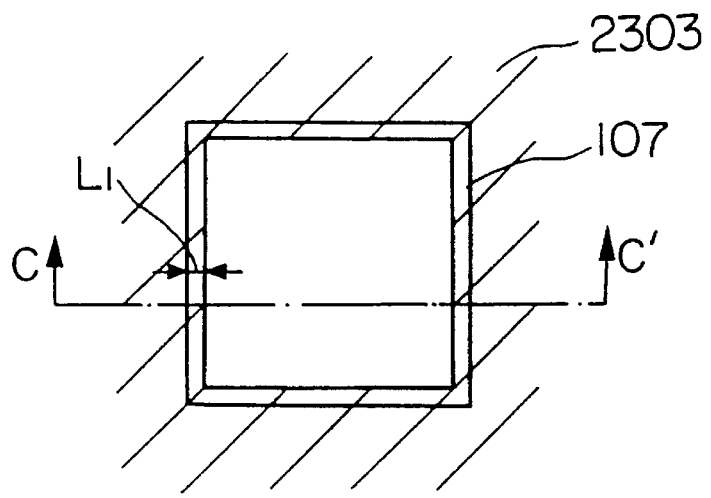
FIGS. 23A and 23B are views of one example of liquid crystal displays based on this invention.
Figure 23B:
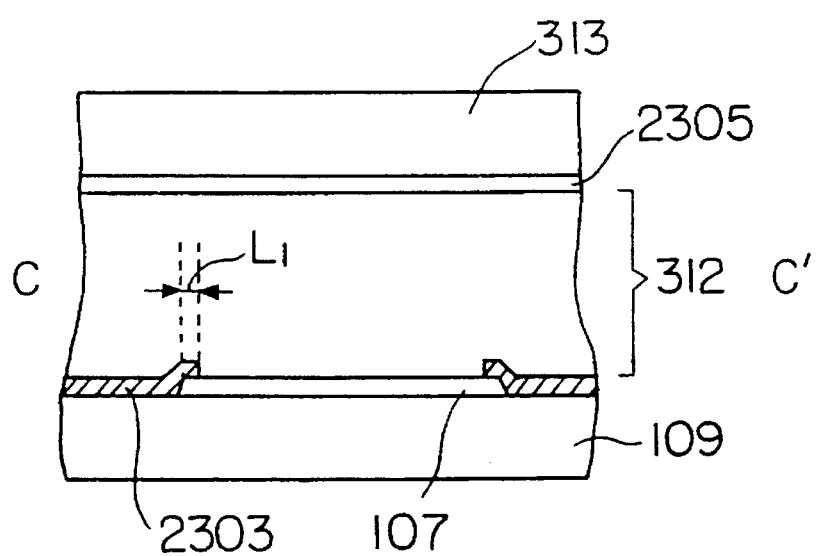

Furthermore the aperture ratio can be further improved by using in the third protective insulating film 2219 a material which is absorptive of light within the visible radiation range, e.g., a black insulating material prepared by dying an organic substance, such as gelatin, polyimide or others, with a highly insulative red, green or blue coloring matter, an organic material dyed with iodine or others. This will be explained in more detail with reference to FIGS. 23, 24 and 25. FIG. 23 shows one example of the liquid crystal display according to this invention. FIG. 23A is a top view of the liquid crystal display according to the example, and FIG. 23B is a sectional view along the line C—C' in FIG. 23A. An A-length square pixel electrode 107 is formed on a glass substrate 109, and the third protective insulating layer 2303 also functioning as a light shielding layer is provided to overlap the pixel electrode 107 by a length L1 in FIG. 23. This length L1 is determined by an alignment precision of the lithography used in opening the window 2220 on the pixel electrode 107 opened concurrently with the contact hole 2206. Generally the length L1 can be easily retained below 1 μm by an alignment mechanism using the diffraction of a laser beam. The aperture ratio T1 is expressed by $$T1=\{(A-L1)(A-L1)/A \times A\} \times 100\ (\%) \quad (1).$$

Figure 24A:
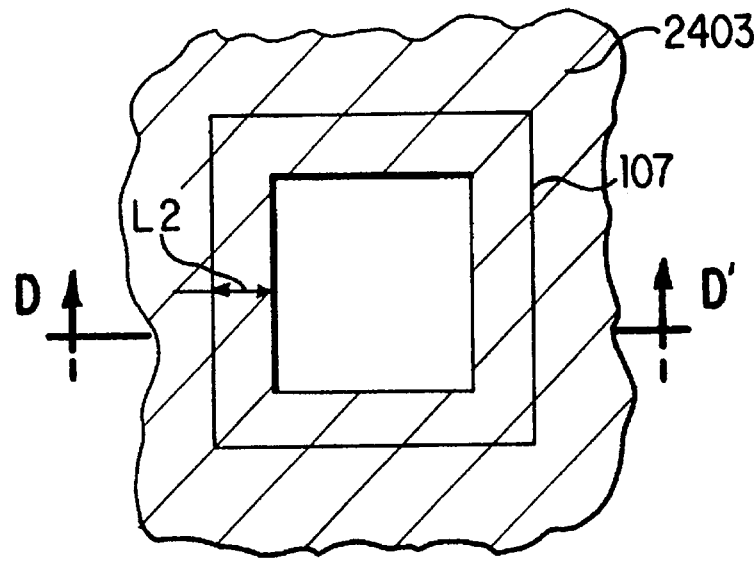
FIGS. 24A and 24B are views of one example of the conventional liquid crystal displays.
Figure 24B:
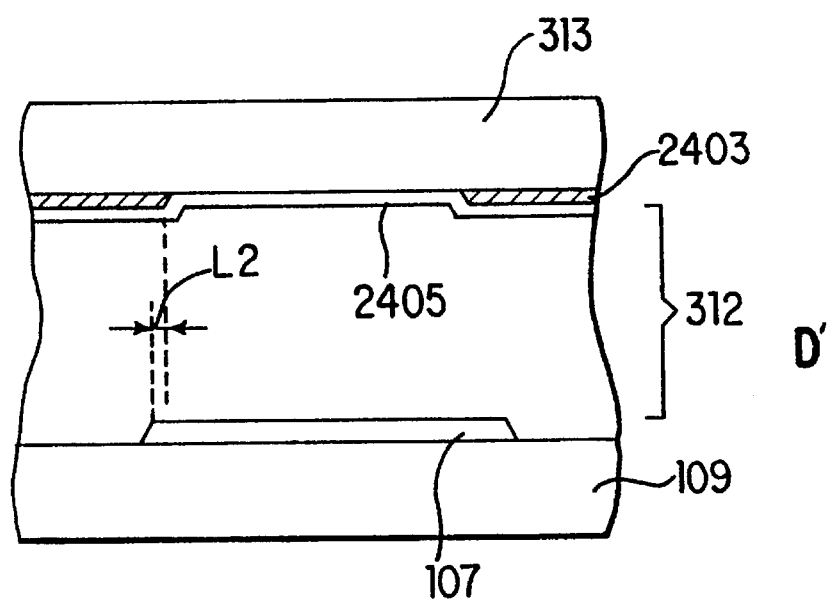

FIG. 24 shows the liquid display according to another example of this invention. FIG. 24A is a top view of the liquid display according to another example of this invention, and FIG. 24B is a sectional view along the line D—D'. There is provided an A-length square pixel electrode 107 on a glass substrate 109. This liquid crystal display comprises a liquid crystal layer 312 sandwiched between this glass substrate 109 and an opposed glass substrate 313 having a light shielding layer 2403 and a common electrode 2405 disposed thereon. A length L2 is determined by a mechanical positioning precision of the relative position between the glass substrate 109 and the opposed glass substrate 313. This length L2 usually requires 5 μm. An aperture ratio T2 is expressed by $$T2=\{(A-L2)(A-L2)\}/A \times A \times 100\ (\%) \quad (2).$$

Figure 25:
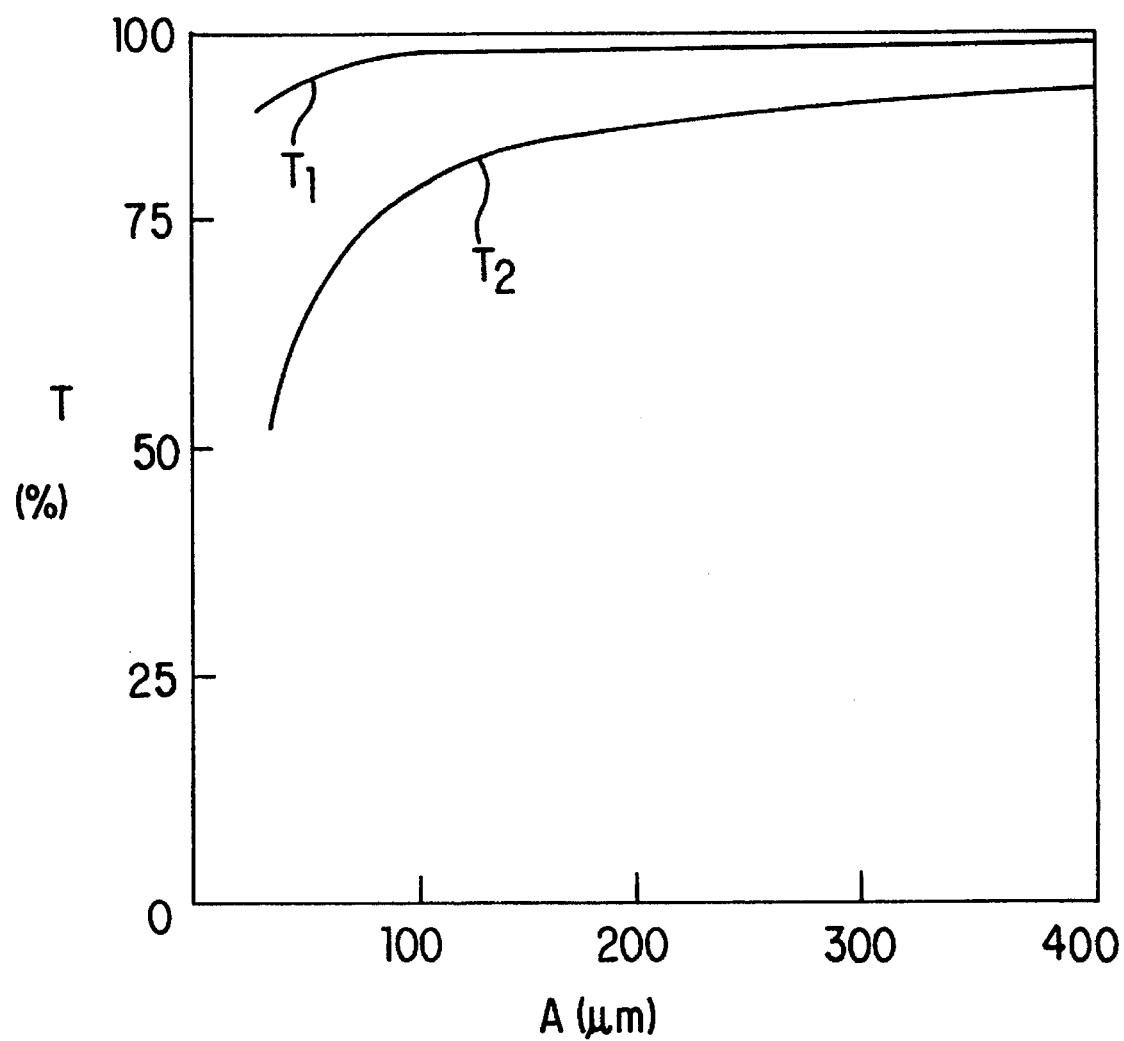
FIG. 25 is a view showing the relationships between one side of a picture element electrode and an aperture ratio.

FIG. 25 shows the relationships between a length A of one side of the pixel electrode 107 taken on the horizontal axis, and an aperture ratio T taken on the vertical axis when L1 and L2 in the expressions (1) and (2) are 1 μm and 2 μm respectively. In the conventional liquid crystal display, the aperture ratio T2 abruptly lowers when the length A of one side of the pixel electrode becomes below 100 μm, and about 5.5% when the length A is 40 μm. In contrast to this, in the liquid crystal display, an aperture ratio T1 above 90% is always secured when the length A is 40 μm. The liquid crystal display of this invention is effective especially as a liquid crystal display of high density and high precision having a 40–200 μm length A.

Figure 26A:
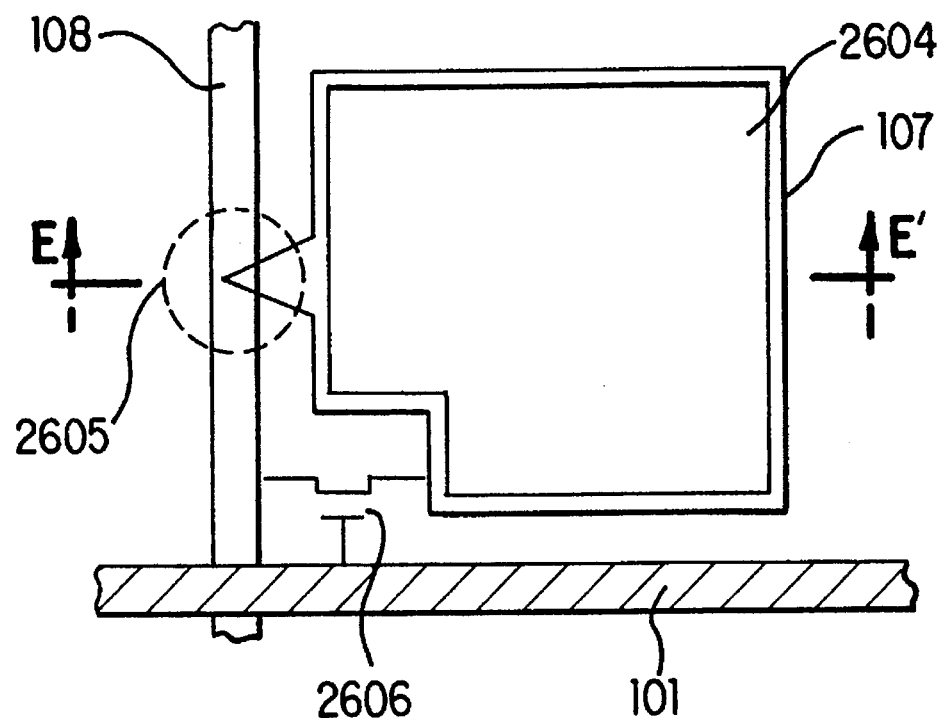
FIGS. 26A and 26B are views of remedies for short-circuit defects resulting from film abnormalities of the ITO film forming the picture element electrode.
Figure 26B:
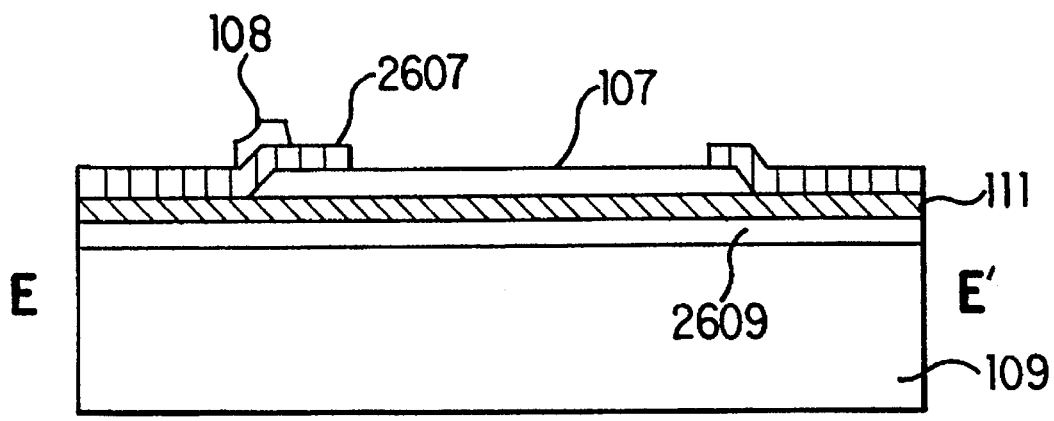

The third protective insulating film also functioning as the light shielding layer makes it possible to raise the aperture ratio as described above, and at the same time to decrease the occurrence of the short-circuit. This will be explained with reference to FIG. 26. FIG. 26A is a top view of the active matrix substrate according to this invention, and FIG. 28B is a sectional view along the line E—E' in FIG. 28A. A pixel electrode 107 is formed of ITO on a glass substrate with a gate insulating film 111 formed on. The ITO film has largely variable etching speeds depending on its oxygen content and the heating temperature at the time of its formation, and its surface conditions, as of concavities and convexities, etc., are changed. ITO film is a difficult material to obtain a stable film quality and close contact with a photoresist. Often such abnormal film conditions locally take place, and a plurality of projections 2605 tend to be formed. But the projections 2605 are insulated from the data bus 108 by the third protective insulating film 2607, and no short-circuit takes place. Thus the provision of the third protective insulating film 2607 also functioning as the light shielding layer makes it possible to realize displays which are bright and of high picture quality as well as defect-free, and especially displays which are optimum to be used in video projectors, etc. which require small sizes and high precision.

In the active matrix substrate according to this invention, an insulating film-coated scanning line, a semiconductor layer covered with a gate insulating film constituting a thin film transistor, a gate electrode constituting the thin film transistor are laid on each other in the stated order, whereby the intersection between the scanning line and the data bus has multi-layer structures. Consequently even when a defect, such as a pin hole or others, takes place in one of the layers, the remaining layers free from any defect can still retain the insulation, with the result of no short-circuit. Furthermore, because the scanning line and the gate electrode are separately formed, optimum materials can be optionally selected for them. Furthermore, because the scanning line can be formed at bottom positions, the insulation resistance between the scanning line and a liquid crystal layer can be made high, and the direct current charge to the liquid crystal layer can be reduced.

Consequently this invention can provide the following superior advantageous effects.

Firstly, by providing a multi-layer structure at the intersection between the scanning line and the data bus, the short-circuit at the intersection between the scanning line and the data bus can be eliminated in principle. In applications to liquid crystal displays, their display quality, and yields can be improved, and their costs can be reduced.

Secondly, because the scanning line, and the gate electrode of a thin film transistor are formed separately, optimum materials can be optionally selected respectively for the scanning line and the gate electrode of the thin film transistor.

Thirdly, the scanning line can be provided at lower positions of the respective layers, the direct current charge to the liquid crystal layer can be reduced.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A liquid crystal device, comprising:

a pair of opposed and spaced apart insulating substrates;

a plurality of scanning lines and a plurality of data lines disposed on one of the substrates, the scanning lines intersecting the data lines at cross-over locations;

a plurality of switching elements connected to the scanning lines and the data lines;

pixel electrodes arranged on the one of the substrates, each of the pixel electrodes being electrically connected to respective ones of the switching elements and being extended so as to overlap one of the scanning lines connected to an adjacent one of the switching elements;

a plurality of first layers located between each of the scanning lines and each of the data lines at the cross-over locations, said plurality of first layers including a first electrically conductive film, a tantalum oxide film and an electrically insulating film; and a plurality of second layers located between each of the pixel electrodes and each of the scanning lines, the plurality of second layers including a plurality of electrically insulating films and a second electrically conductive film.

2. A liquid crystal device, comprising:

a pair of opposed and spaced apart insulating substrates;

a plurality of scanning lines and a plurality of data lines disposed on one of the substrates, the scanning lines intersecting the data lines at cross-over locations;

a plurality of switching elements connected to the scanning lines and the data lines;

pixel electrodes arranged on the one of the substrates, each of the pixel electrodes being electrically connected to respective ones of the switching elements and being extended so as to overlap one of the scanning lines connected to an adjacent one of the switching elements;

a plurality of first layers located between each of the scanning lines and each of the data lines at the cross-over locations, said plurality of first layers including a first electrically conductive film, a silicon oxide film and a tantalum oxide film; and a plurality of second layers located between each of the pixel electrodes and each of the scanning lines, the plurality of second layers including a plurality of electrically insulating films and a second electrically conductive film.

3. The liquid crystal device of claim 2, wherein the switching elements comprise thin film transistors including gate electrodes electrically connected to the scanning lines, wherein each of the gate electrodes is made of a same material as the first and second electrically conductive films.

4. The liquid crystal device of claim 2, wherein the switching elements comprise thin film transistors including gate electrodes, said gate electrodes are connected to the scanning lines through gate wirings, and the scanning lines are made of a material different than the gate electrodes, the scanning lines being made of a material selected from the group consisting of Cr, Ta, and ITO and the gate electrodes being made of a material selected from the group consisting of Cr, and Mo.

5. A liquid crystal device, comprising:

a pair of opposed and spaced apart insulating substrates;

a plurality of scanning lines and a plurality of data lines disposed on one of the substrates, the scanning lines intersecting the data lines at cross-over locations;

a plurality of switching elements connected to the scanning lines and the data lines;

pixel electrodes arranged on the one of the substrates, each of the pixel electrodes being electrically connected to respective ones of the switching elements and being extended so as to overlap one of the scanning lines connected to an adjacent one of the switching elements;

a plurality of first layers located between each of the scanning lines and each of the pixel electrodes, said plurality of first layers including a first conductive film and a first plurality of electrically insulating films; and a plurality of second layers located between each of the scanning lines and each of the data lines at the cross-over locations, said plurality of second layers including a electrically conductive layer and a second plurality of electrically insulating films, one of the second plurality of electrically insulating films being a light shielding layer and being provided so as to overlap the pixel electrode.

6. The liquid crystal device of claim 5, wherein the switching elements comprise thin film transistors including gate electrodes electrically connected to the scanning lines, wherein the gate electrodes are made of a same material as the electrically conductive layer.

7. The liquid crystal device of claim 5, wherein the switching elements comprise thin film transistors including gate electrodes, said gate electrodes are connected to the scanning lines through gate wirings, and the scanning lines are made of a material different than the gate electrodes, the material from which the scanning lines are made being selected from the group consisting of Cr, Ta, and ITO and the gate electrodes being made of a material selected from the group consisting of Cr, and Mo.

* * * * *